(12) United States Patent
Parekh

(10) Patent No.: US 8,344,436 B2
(45) Date of Patent: Jan. 1, 2013

(54) SEMICONDUCTOR CONSTRUCTIONS AND ELECTRONIC SYSTEMS

(75) Inventor: Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/196,761

(22) Filed: Aug. 2, 2011

(65) Prior Publication Data

US 2011/0284940 A1  Nov. 24, 2011

Related U.S. Application Data

(62) Division of application No. 12/852,169, filed on Aug. 6, 2010, now Pat. No. 8,013,376, which is a division of application No. 11/745,783, filed on May 8, 2007, now Pat. No. 7,790,529.

(51) Int. Cl.
*H01L 27/108* (2006.01)
(52) U.S. Cl. . 257/296; 257/300; 257/592; 257/E27.093; 257/E21.205; 438/185; 438/349
(58) Field of Classification Search .................. 257/296, 257/300, 592, E27.093, E21.205; 438/182, 438/349
See application file for complete search history.

(56) References Cited

U.S. PATENT DOCUMENTS

| 5,445,107 | A | 8/1995 | Roth et al. |
|---|---|---|---|
| 5,891,763 | A | 4/1999 | Wanlass |
| 6,174,754 | B1 | 1/2001 | Lee et al. |
| 6,448,115 | B1 | 9/2002 | Bae et al. |
| 6,465,865 | B1 | 10/2002 | Gonzalez |
| 7,233,054 | B1 | 6/2007 | Anh et al. |
| 7,233,754 | B2 | 6/2007 | Kida |
| 2004/0040492 | A1 | 3/2004 | Sakaguchi |
| 2005/0133789 | A1 | 6/2005 | Oh |
| 2005/0280113 | A1 | 12/2005 | Kim |
| 2006/0006442 | A1 | 1/2006 | Gonzalez |
| 2007/0210366 | A1 | 9/2007 | Sandhu et al. |
| 2007/0218616 | A1 | 9/2007 | Parekh |
| 2007/0267668 | A1 | 11/2007 | Fischer |

FOREIGN PATENT DOCUMENTS

WO   PCT/US08/059788   9/2008

OTHER PUBLICATIONS

Yeo et al., "80 nm 512M DRAM with Enhanced Date Retention Time Using Partially-Insulated Cell Array Transistor (PiCAT)", 2004.

*Primary Examiner* — Thanh V Pham
(74) *Attorney, Agent, or Firm* — Wells St. John P.S.

(57) ABSTRACT

Some embodiments include DRAM having transistor gates extending partially over SOI, and methods of forming such DRAM. Unit cells of the DRAM may be within active region pedestals, and in some embodiments the unit cells may comprise capacitors having storage nodes in direct contact with sidewalls of the active region pedestals. Some embodiments include 0C1T memory having transistor gates entirely over SOI, and methods of forming such 0C1T memory.

10 Claims, 18 Drawing Sheets

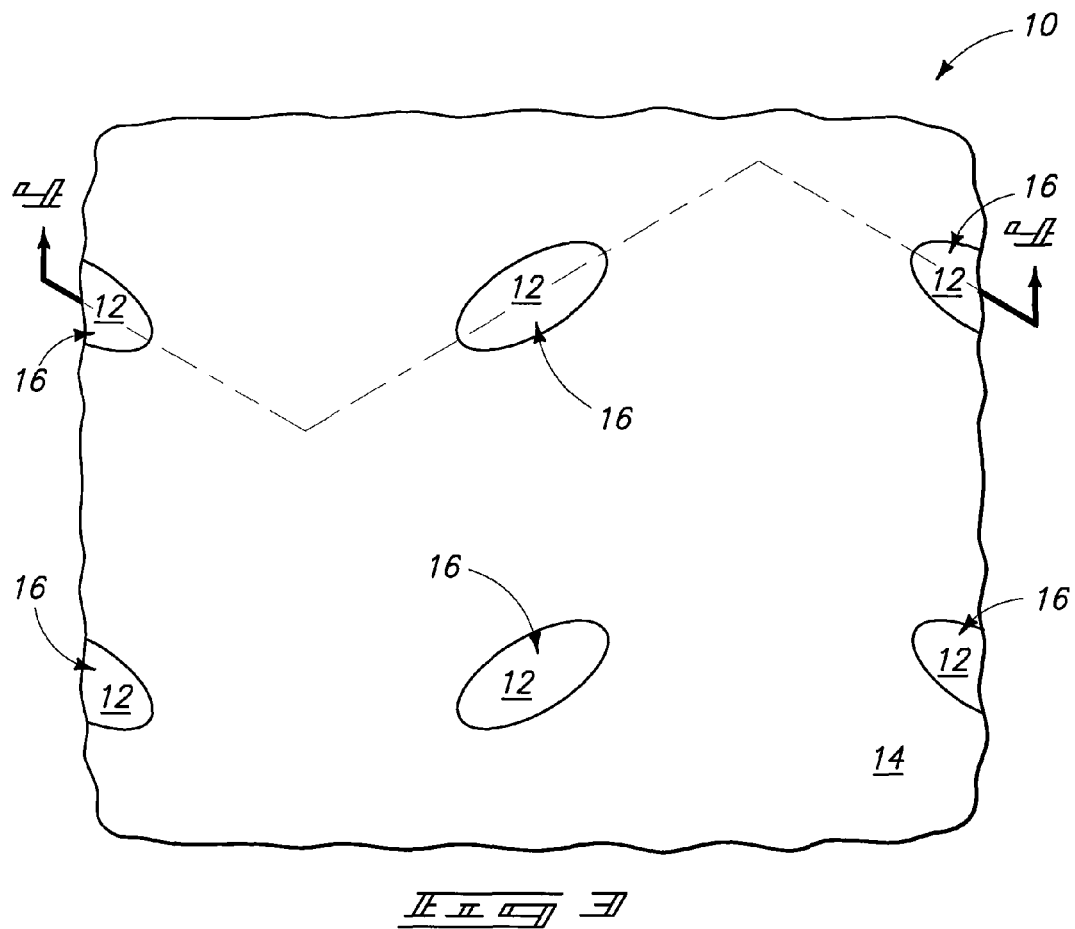
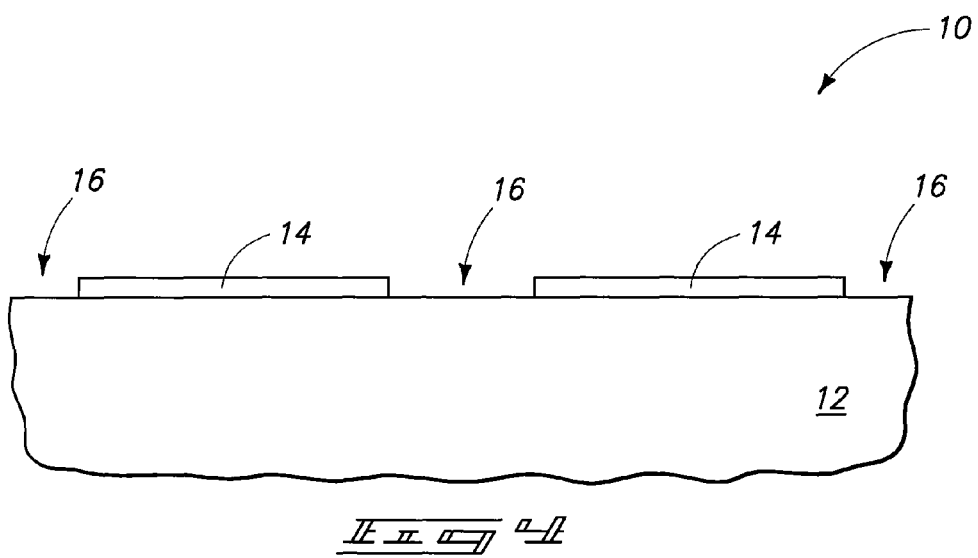

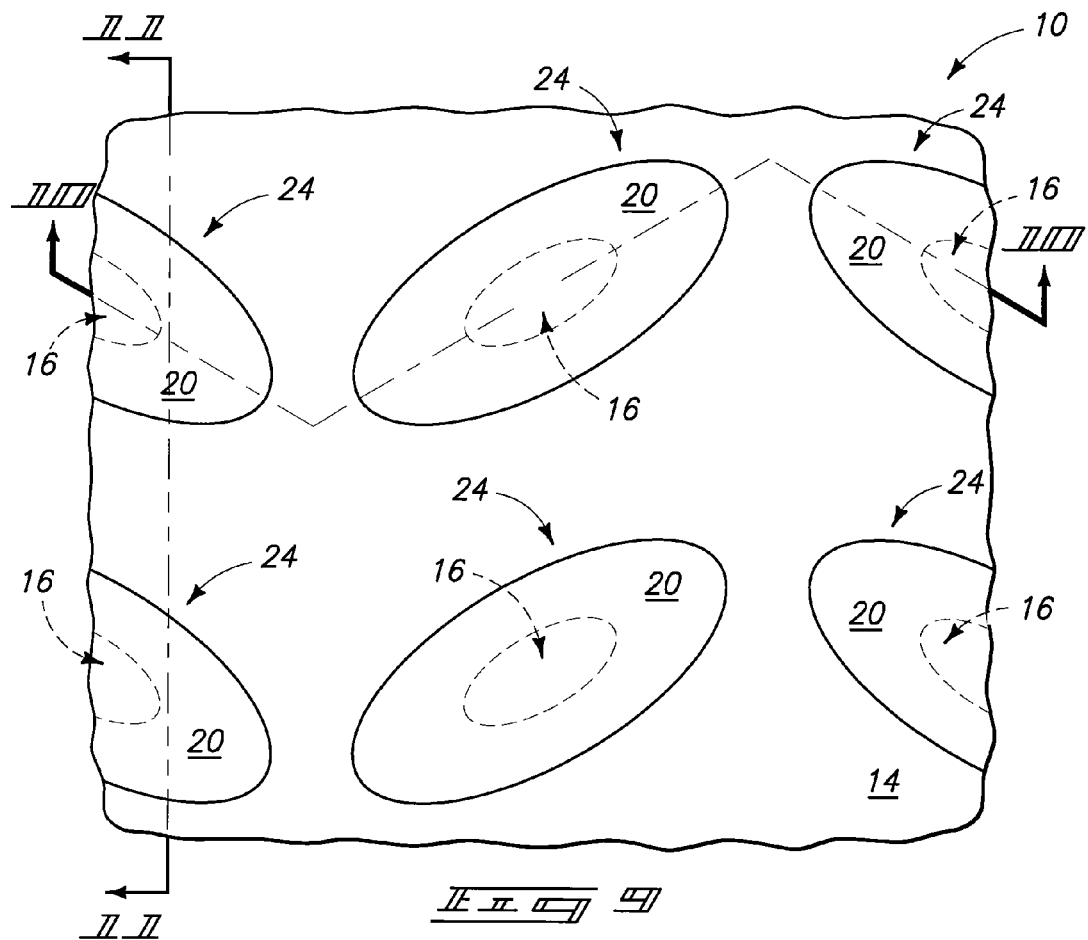
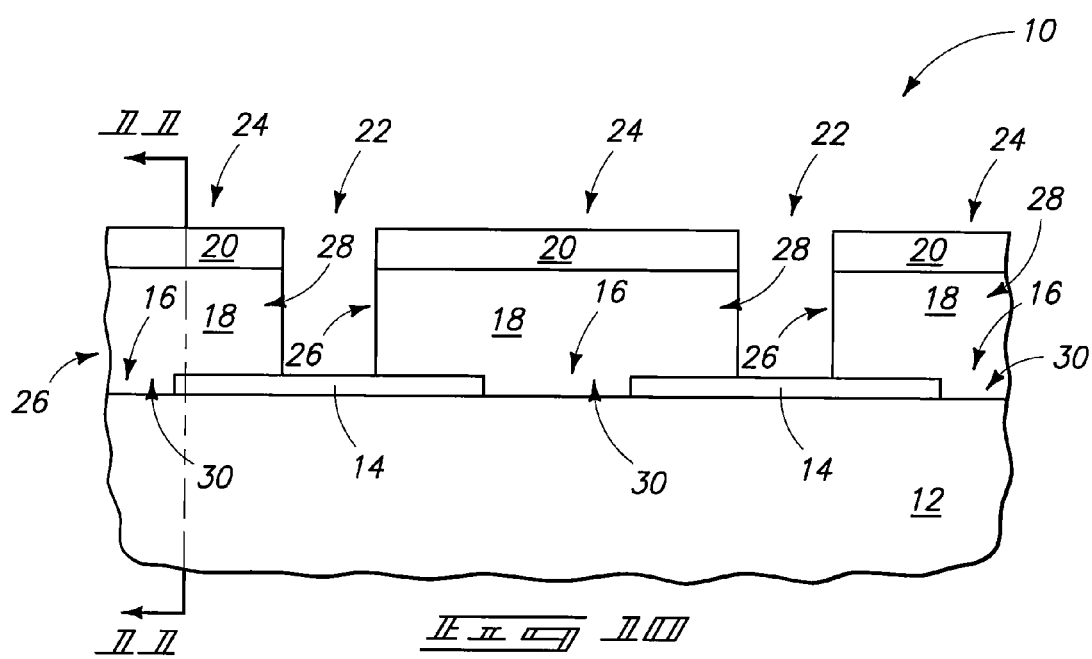

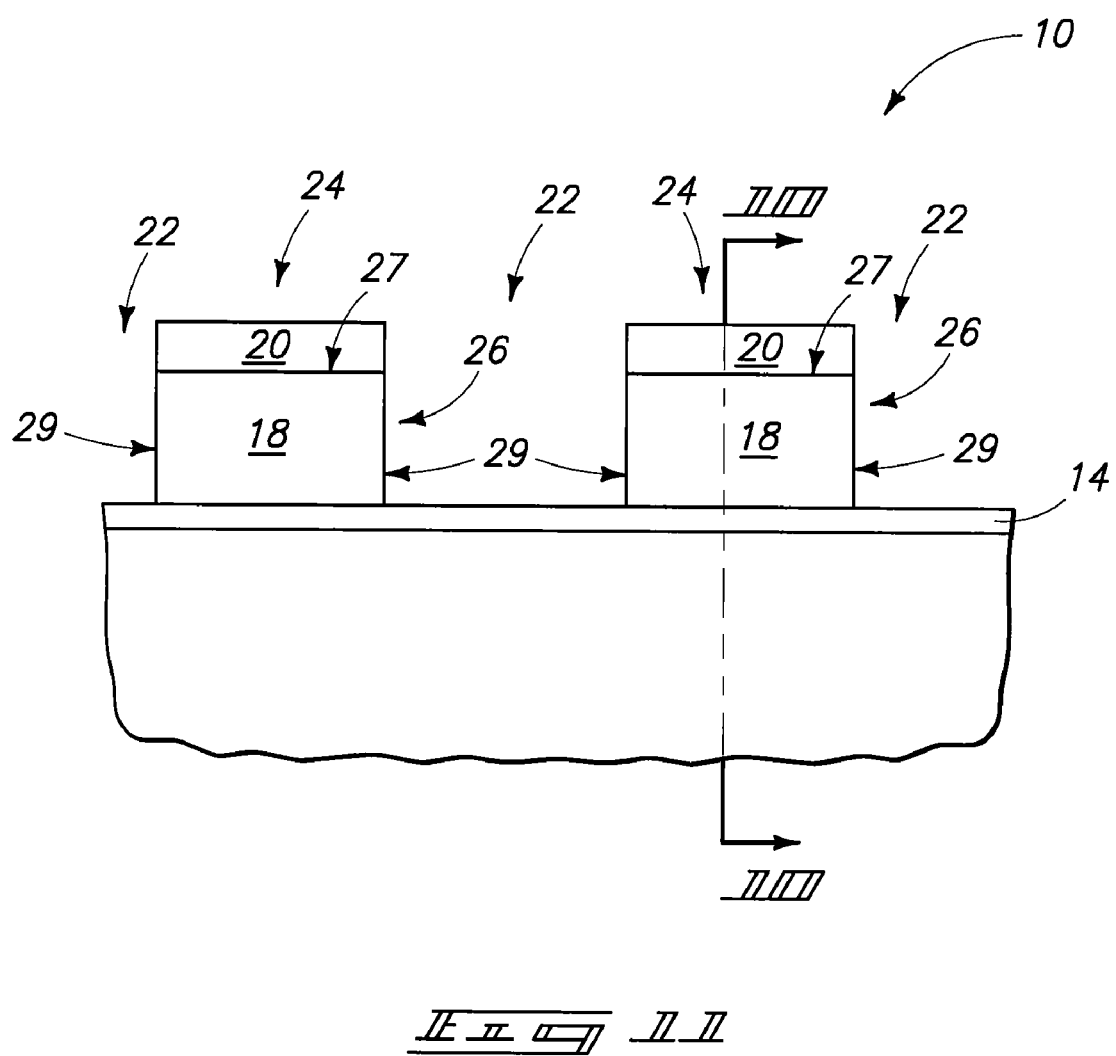
FIG. III

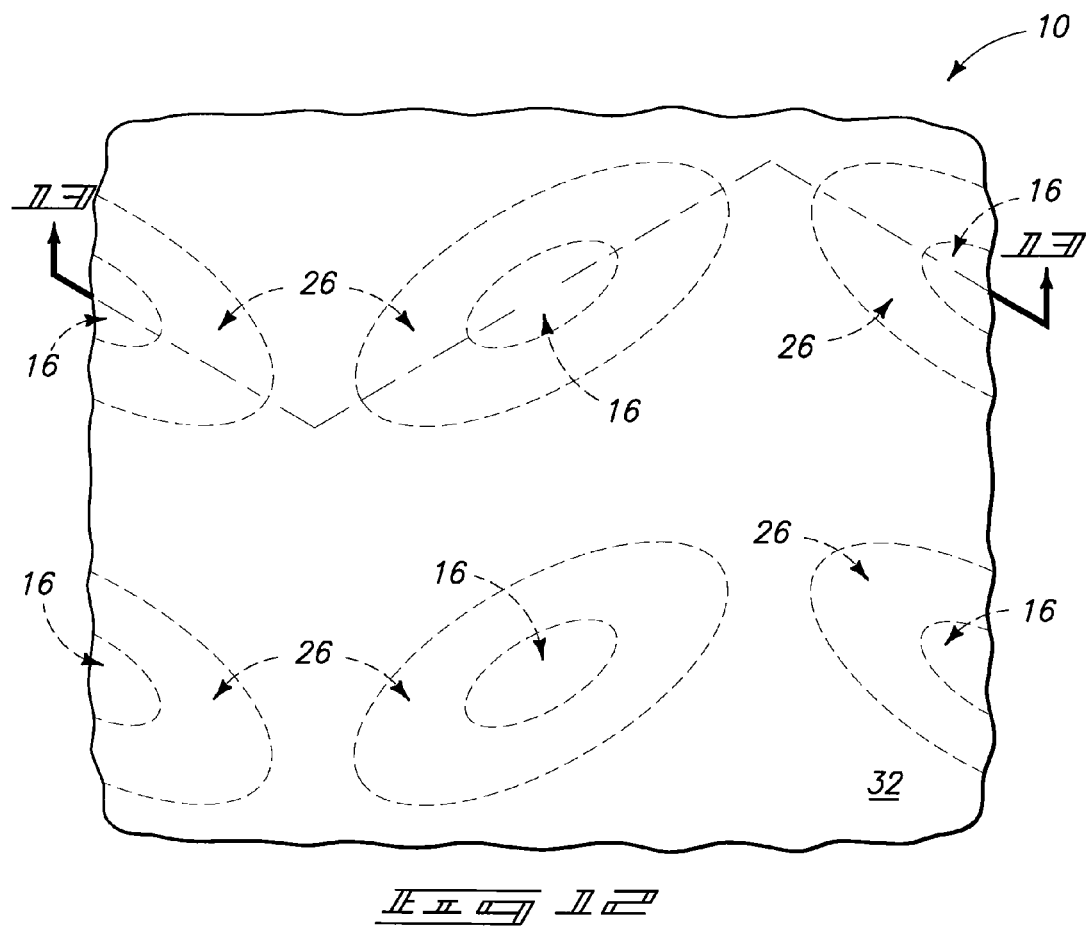
_FIG 12_
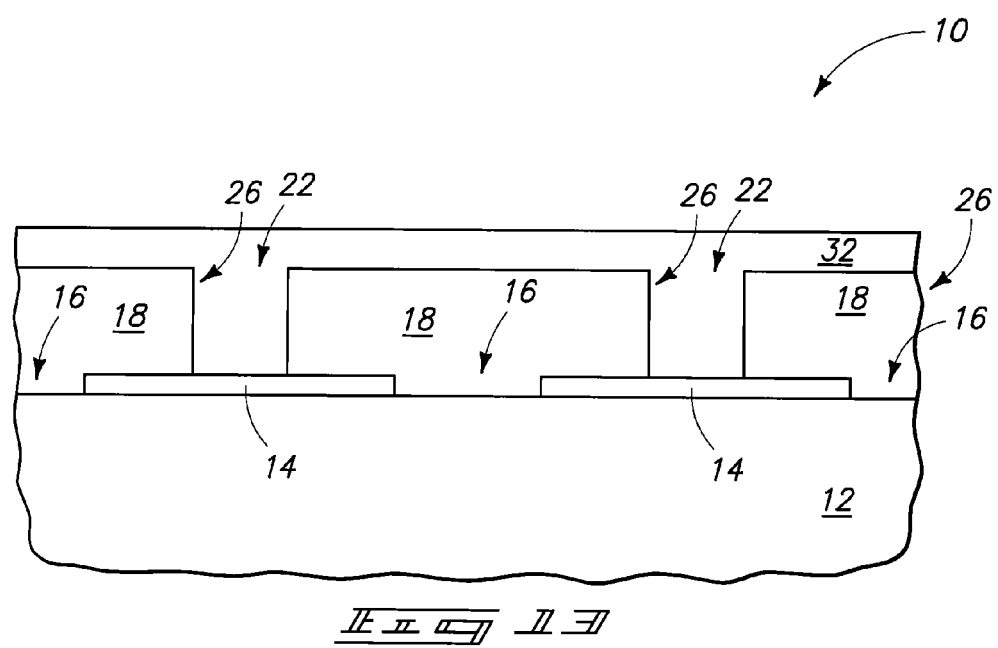
_FIG 13_

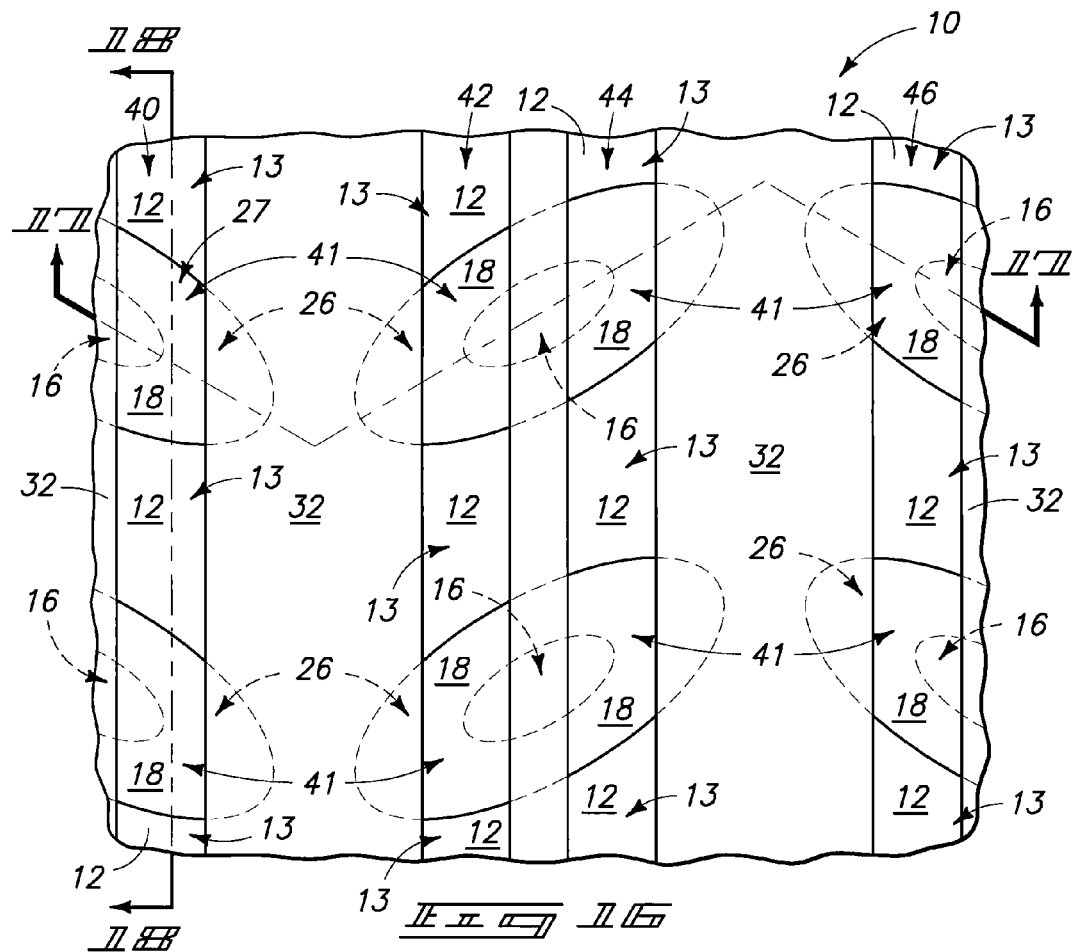
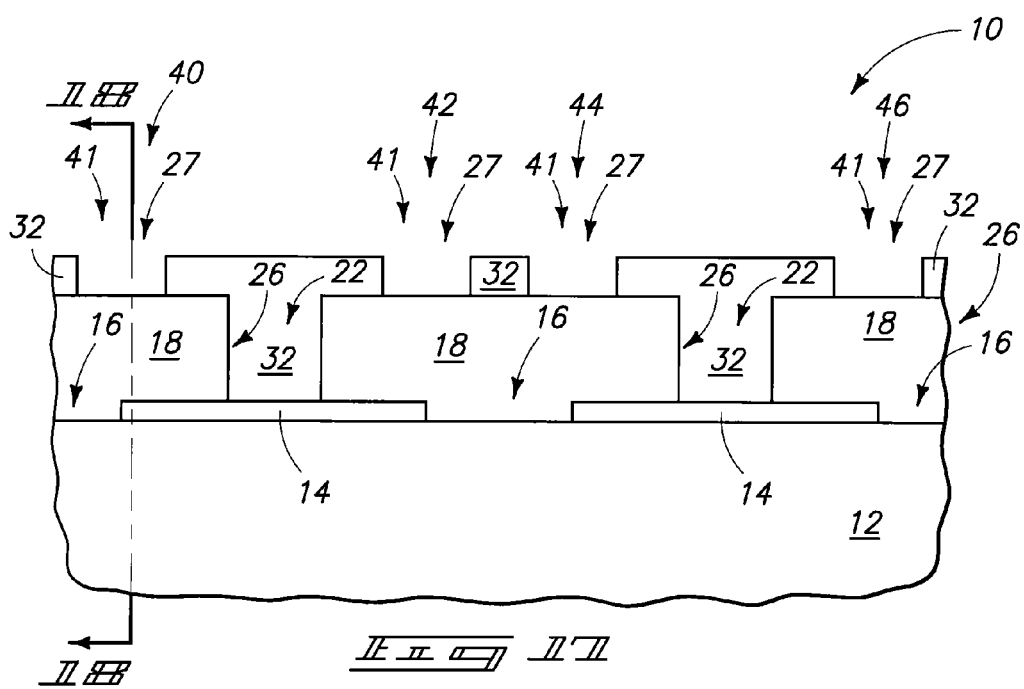

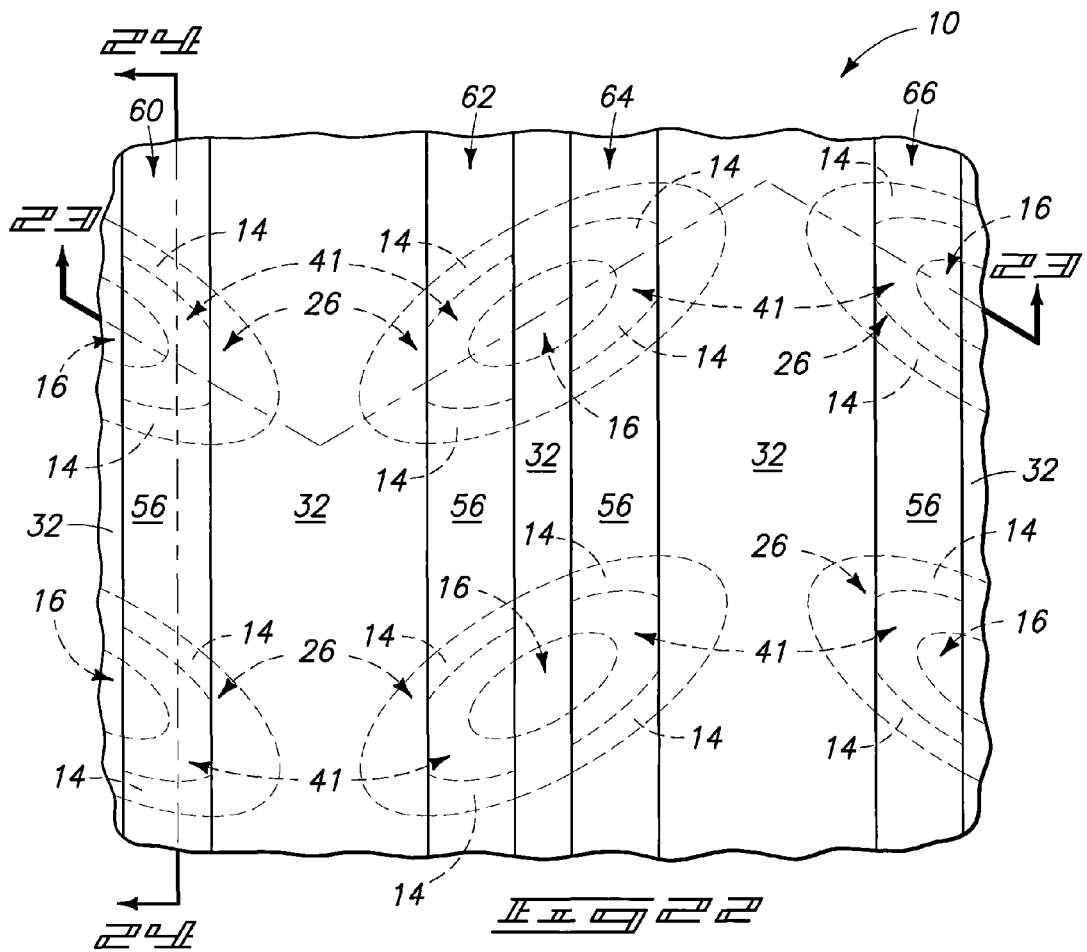
F I G 22
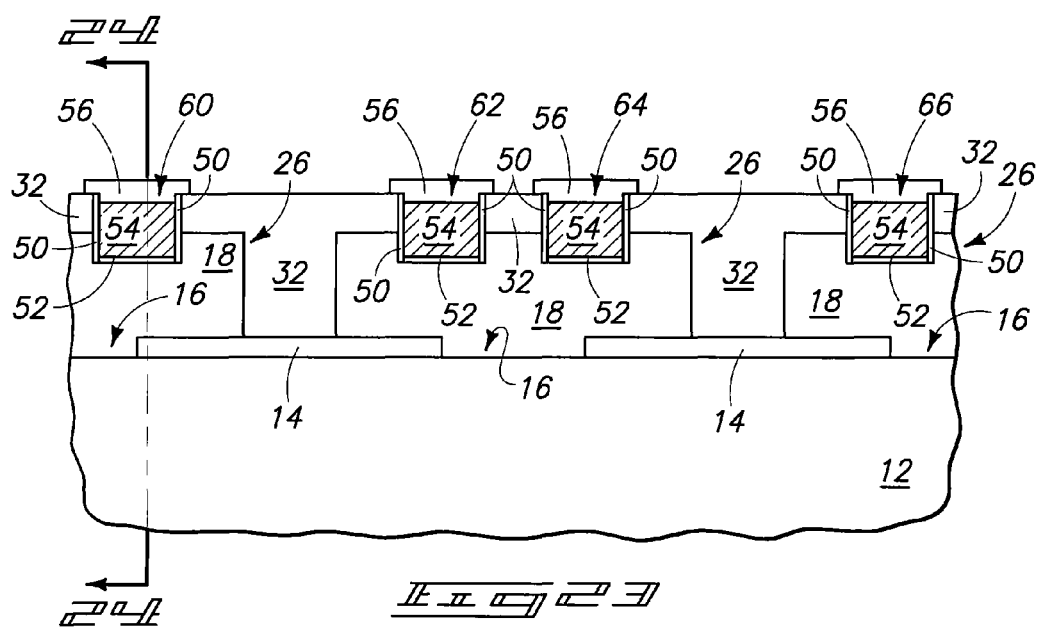
F I G 23

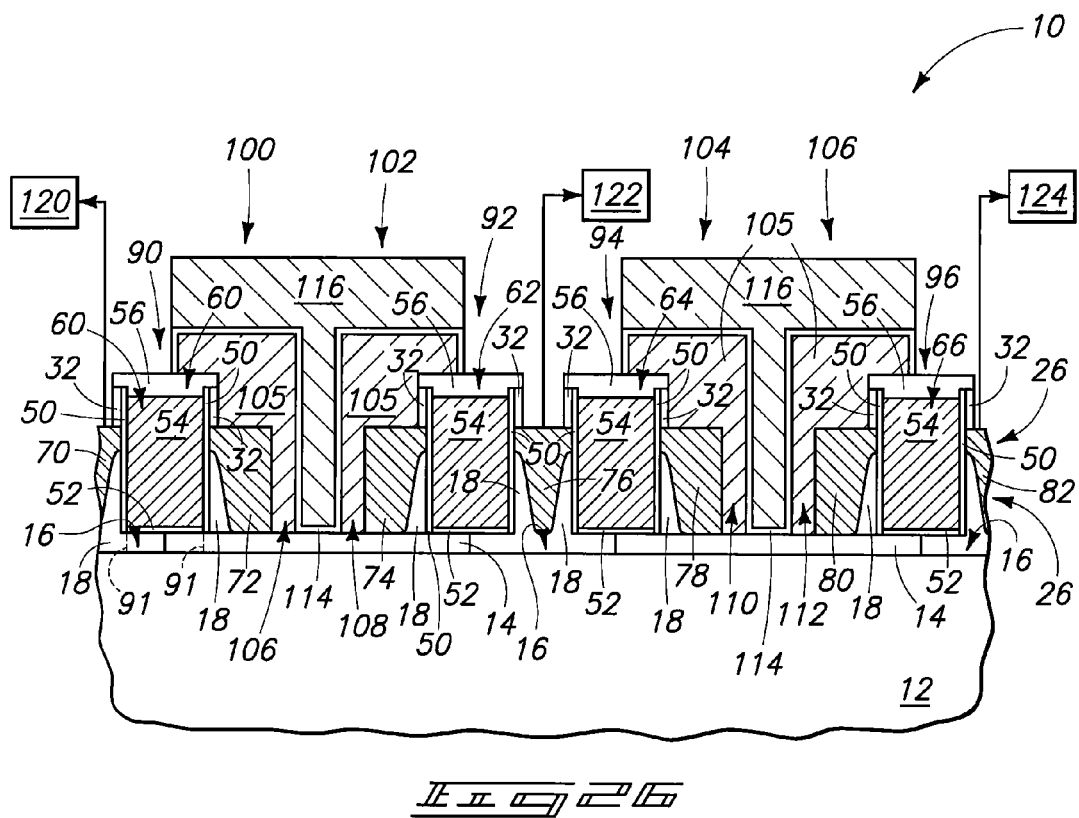
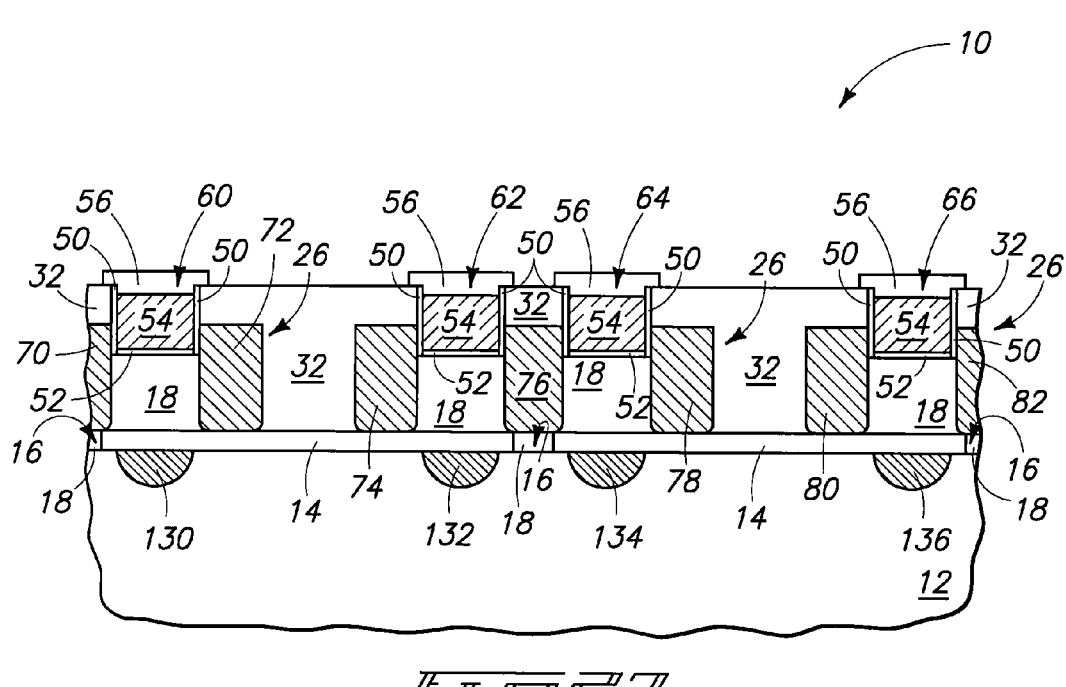

SEMICONDUCTOR CONSTRUCTIONS AND ELECTRONIC SYSTEMS

RELATED PATENT DATA

This patent resulted from a divisional of U.S. patent application Ser. No. 12/852,169, which was filed Aug. 6, 2010, which is hereby incorporated herein by reference; which resulted from a divisional of U.S. patent application Ser. No. 11/745,783, which was filed May 8, 2007, which is now U.S. Pat. No. 7,790,529, and which is hereby incorporated herein by reference.

TECHNICAL FIELD

Memory arrays, semiconductor constructions and electronic systems; and methods of forming memory arrays, semiconductor constructions and electronic systems.

BACKGROUND

Integrated circuitry may include arrays of memory devices for data storage. The memory devices may, for example, be dynamic random access memory (DRAM) devices; with the DRAM unit cells corresponding to transistors coupled with charge storage devices (typically capacitors). Alternatively, the memory devices may lack the capacitors of DRAM. Such memory may be referred to as zero-capacitor-one-transistor (0C1T) memory, and may correspond to so-called ZRAM™ (zero capacitance DRAM).

A continuing goal of integrated circuit fabrication is to increase the level of integration; with a corresponding goal to decrease the size of memory devices, to simplify memory devices, and/or to reduce the complexity and amount of wiring associated with memory devices. Another continuing goal of integrated circuit fabrication is to reduce the number of steps of a fabrication process, thereby improving throughput and possibly reducing costs.

One approach being utilized to increase integration is to incorporate partially-insulated transistors into memory devices. More specifically, the approach is to utilize partial semiconductor on insulator (SOI) to alleviate leakage at source/drain junctions of transistor devices. The individual transistor devices comprise a gate, and a pair of source/drain regions on opposing sides of the gate. The source/drain regions extend within a first semiconductor material, and have insulator directly beneath them which isolates them from a bulk semiconductor material beneath the first semiconductor material. The insulator provided beneath the source/drain regions does not extend under the transistor gate to any substantial degree.

It is desired to develop improved memory devices, and improved methods for fabricating memory devices. Although some embodiments disclosed herein were motivated, at least in part, by such a desire, other embodiments may have applications beyond memory device structures and fabrication.

BRIEF DESCRIPTION OF THE DRAWINGS

FIGS. 3 and 4 are views of the portions of FIGS. 1 and 2, respectively, at a processing stage subsequent to that of FIGS. 1 and 2. The cross-section of FIG. 4 is along the line 4-4 of FIG. 3.

FIGS. 9-11 are views of the construction of FIGS. 1 and 2 at a processing stage subsequent to that of FIGS. 7 and 8. FIGS. 9 and 10 are views of the portions of FIGS. 1 and 2, respectively, and FIG. 11 is a view along a cross-section substantially orthogonal to that of FIG. 10. The cross-section of FIG. 10 is along the lines 10-10 of FIGS. 9 and 11; and the cross-section of FIG. 11 is along the lines 11-11 of FIGS. 9 and 10.

FIGS. 12 and 13 are views of the portions of FIGS. 1 and 2, respectively, at a processing stage subsequent to that of FIGS. 9-11. The cross-section of FIG. 13 is along the line 13-13 of FIG. 12.

FIGS. 16-18 are views of the portions of FIGS. 9-11 at a processing stage subsequent to that of FIGS. 14 and 15. The cross-section of FIG. 17 is along the lines 17-17 of FIGS. 16 and 18; and the cross-section of FIG. 18 is along the lines 18-18 of FIGS. 16 and 17.

FIGS. 22-24 are views of the portions of FIGS. 9-11 at a processing stage subsequent to that of FIGS. 19-21. The cross-section of FIG. 23 is along the lines 23-23 of FIGS. 22 and 24; and the cross-section of FIG. 24 is along the lines 24-24 of FIGS. 22 and 23.

FIG. 26 is a cross-sectional view of a portion of a semiconductor construction at the processing stage of FIG. 25, with the cross-section of FIG. 26 being offset relative to that of FIG. 25. FIG. 26 corresponds to a cross-section that would be out of the page relative to the cross-section of FIG. 25.

FIG. 27 is a view of the portion of FIG. 2 at a processing stage analogous to that of FIG. 25, in accordance with another embodiment.

DETAILED DESCRIPTION OF THE ILLUSTRATED EMBODIMENTS

Some embodiments include utilization of partial SOI in transistor devices. The transistor devices may be utilized in DRAM. The transistor devices have insulator extending under a storage node and partially under a transistor gate. A region beneath the transistor gate which is not blocked by insulator may be utilized as a tie between the channel of the transistor and a semiconductor body, while the region which is blocked may alleviate, and in some embodiments prevent, leakage from the storage node back across the access device (so-called gate off-state leakage). In some embodiments, the transistor may be utilized in 0C1T memory and the insulator may completely block the tie between the channel of the transistor and the semiconductor body so that the transistor is a floating device.

Example embodiments are described below with reference to FIGS. 1-31. FIGS. 1-26 illustrate a first embodiment, FIG. 27 illustrates a second embodiment, and FIGS. 27-31 illustrate applications in electronic systems.

Figure 1:
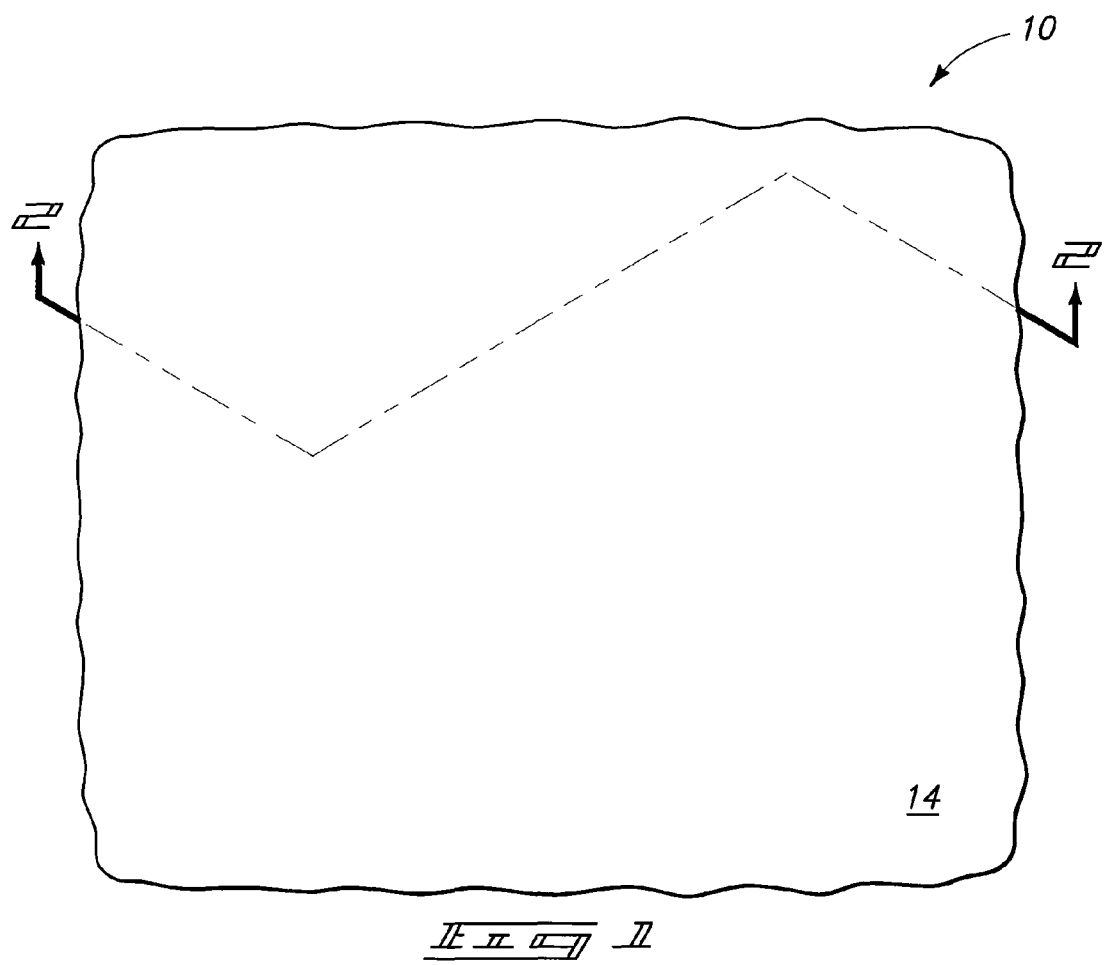
FIGS. 1 and 2 are a diagrammatic fragmentary top view and a cross-sectional side view, respectively, of portions of a semiconductor construction at a processing stage in accordance with an embodiment. The cross-section of FIG. 2 is along the line 2-2 of FIG. 1.
Figure 2:
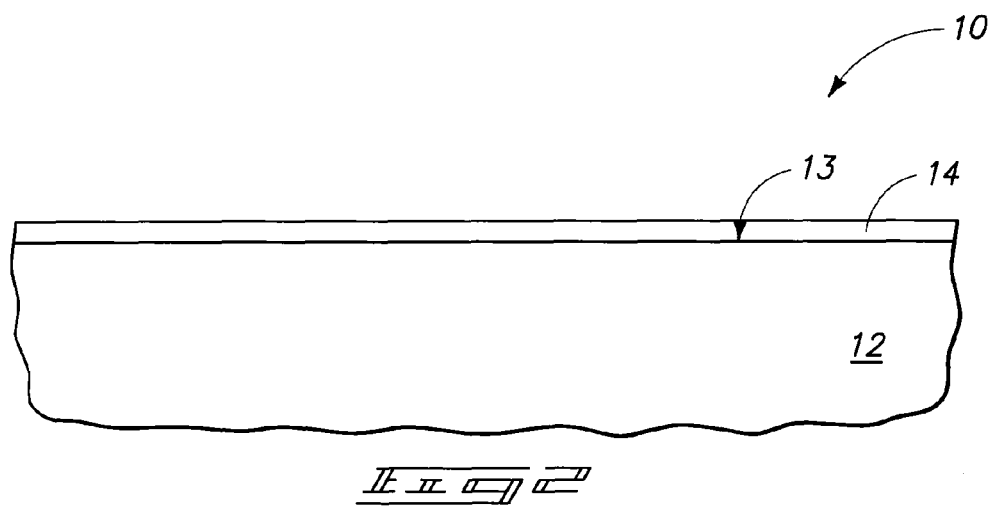

Referring to FIGS. 1 and 2, such illustrate a top view and cross-sectional side view, respectively, of a semiconductor construction 10. The cross-section of FIG. 2 extends through regions which will ultimately be active regions.

The construction 10 includes a bulk semiconductor material 12 having an upper surface 13, and includes a dielectric material 14 extending across the upper surface of the semiconductor material.

The bulk semiconductor material 12 may be referred to as a semiconductor base, and in some embodiments may be referred to as a first semiconductor material to distinguish material 12 from other semiconductor materials that may be formed thereover. The semiconductor material 12 may comprise any suitable composition or combination of compositions, and may, for example, comprise, consist essentially of, or consist of monocrystalline silicon lightly doped with background dopant. Such monocrystalline silicon may be part of a silicon wafer. The semiconductor base may be referred to as a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although base 12 is shown to be homogenous, it is to be understood that the base may comprise numerous layers in some embodiments. For instance, base 12 may correspond to a semiconductor substrate containing one or more layers associated with integrated circuit fabrication. In such embodiments, such layers may correspond to one or more of metal interconnect layers, barrier layers, diffusion layers, insulator layers, etc.

The dielectric material 14 may comprise any suitable electrically insulative composition or combination of compositions, and may, for example, comprise, consist essentially of, or consist of one or both of silicon dioxide and silicon nitride. Dielectric material 14 may alternatively be referred to as electrically insulative material. The dielectric material may be formed with any suitable processing, including, for example, chemical vapor deposition (CVD).

Referring to FIGS. 3 and 4, dielectric material 14 is patterned to form a plurality of openings 16 extending through the dielectric material to the underlying semiconductor material of base 12. The patterning of dielectric material 14 may be accomplished utilizing any suitable processing; including, for example, formation of a photolithographically patterned photoresist mask (not shown) over material 14, transfer of a pattern from the mask to material 14 with one or more suitable etches, and subsequent removal of the mask.

Openings 16 may have any suitable configuration, and in the shown embodiment are substantially elliptical.

Figure 5:
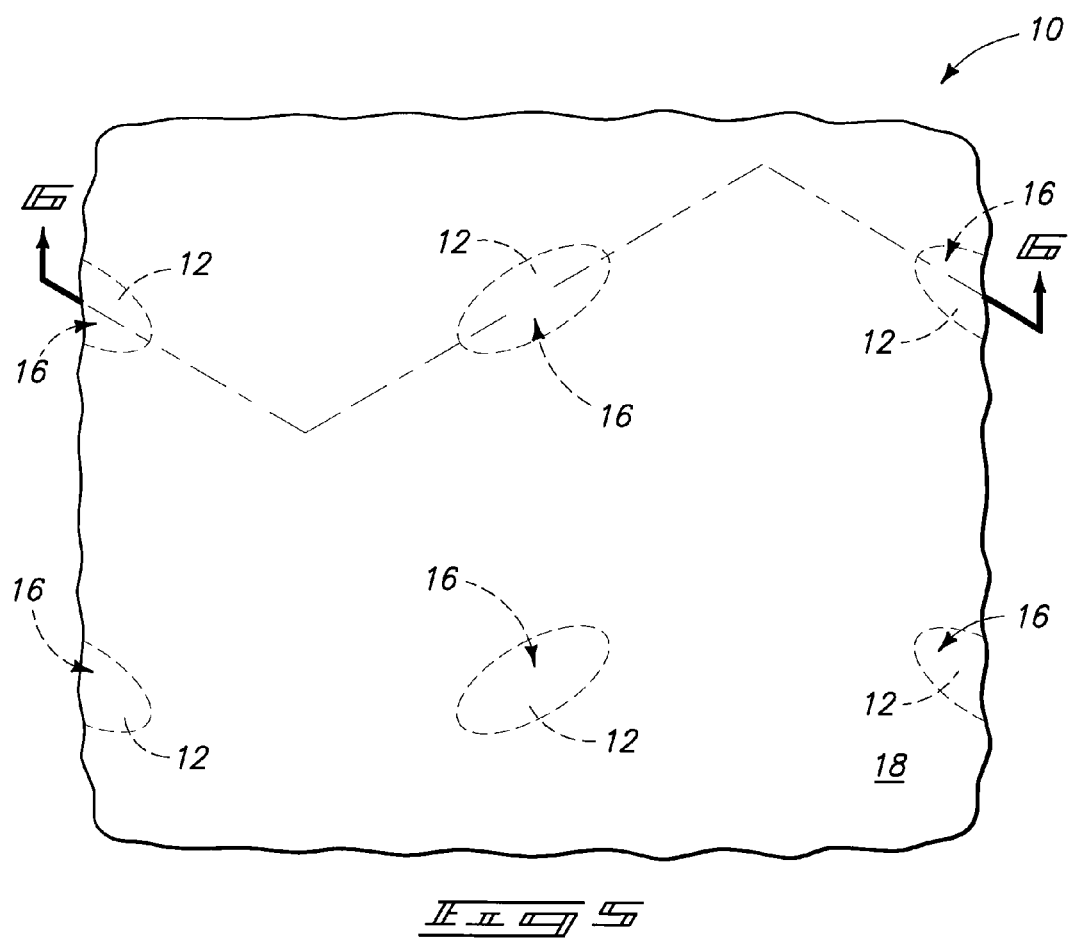
FIGS. 5 and 6 are views of the portions of FIGS. 1 and 2, respectively, at a processing stage subsequent to that of FIGS. 3 and 4. The cross-section of FIG. 6 is along the line 6-6 of FIG. 5.
Figure 6:
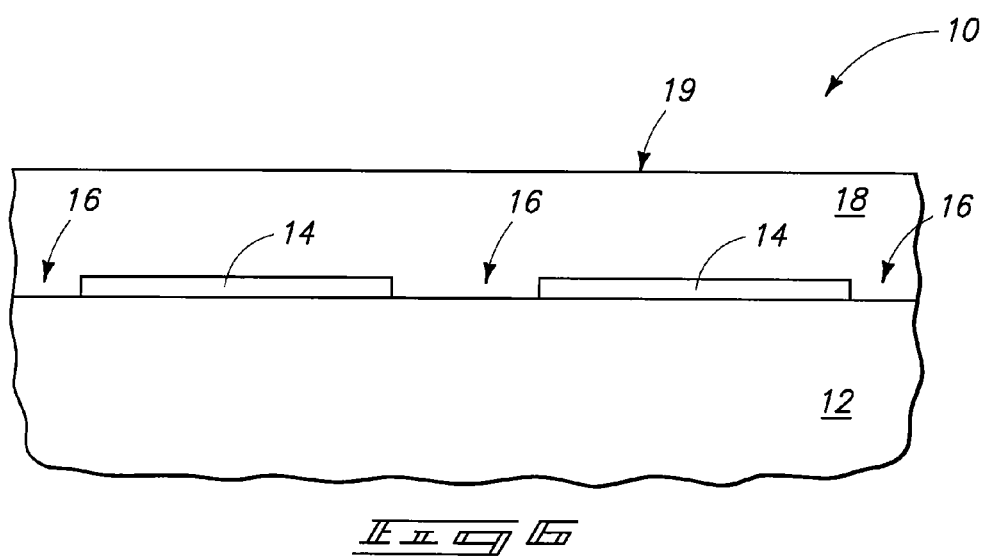

Referring to FIGS. 5 and 6, a second semiconductor material 18 is formed over dielectric material 14 and within the openings 16. The openings 16 are shown in dashed-line view in FIG. 5 to indicate that the openings are beneath the second semiconductor material 18.

The second semiconductor material 18 may be formed by epitaxially growing the second semiconductor material from exposed first semiconductor material 12 within the openings. The second semiconductor material may comprise the same composition as the first semiconductor material, or may comprise a different composition. In some embodiments, the first and second semiconductor materials 12 and 18 both comprise, consist essentially of, or consist of silicon; and in some embodiments may comprise, consist essentially of, or consist of monocrystalline silicon.

Second semiconductor material 18 comprises an upper surface 19. Such upper surface is shown to be substantially planar. The planarization of the upper surface may be accomplished by, for example, chemical-mechanical polishing (CMP).

The second semiconductor material 18 is shown in direct contact with the first semiconductor material 12. If materials 12 and 18 are the same composition as one another, the materials may merge to form a single material. Regardless, material 18 may be considered to be formed in direct contact with material 12.

Figure 7:
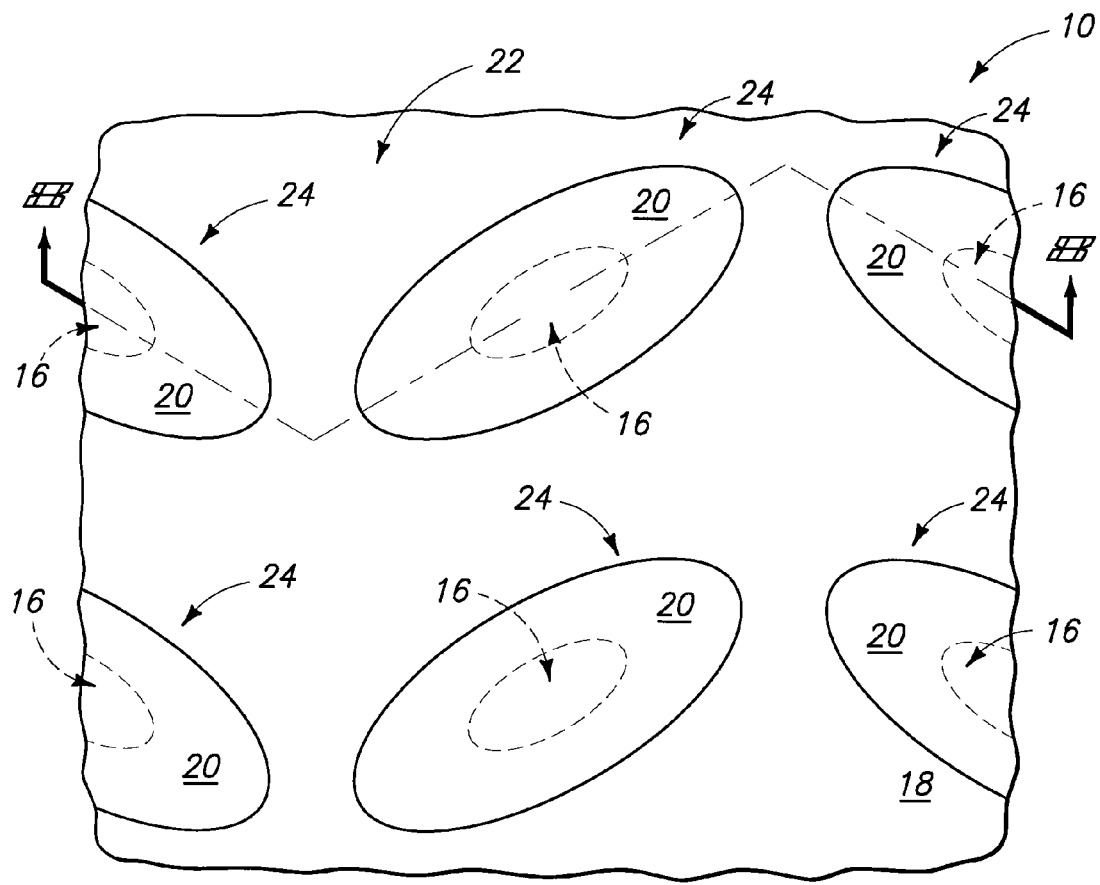
FIGS. 7 and 8 are views of the portions of FIGS. 1 and 2, respectively, at a processing stage subsequent to that of FIGS. 5 and 6. The cross-section of FIG. 8 is along the line 8-8 of FIG. 7.
Figure 8:
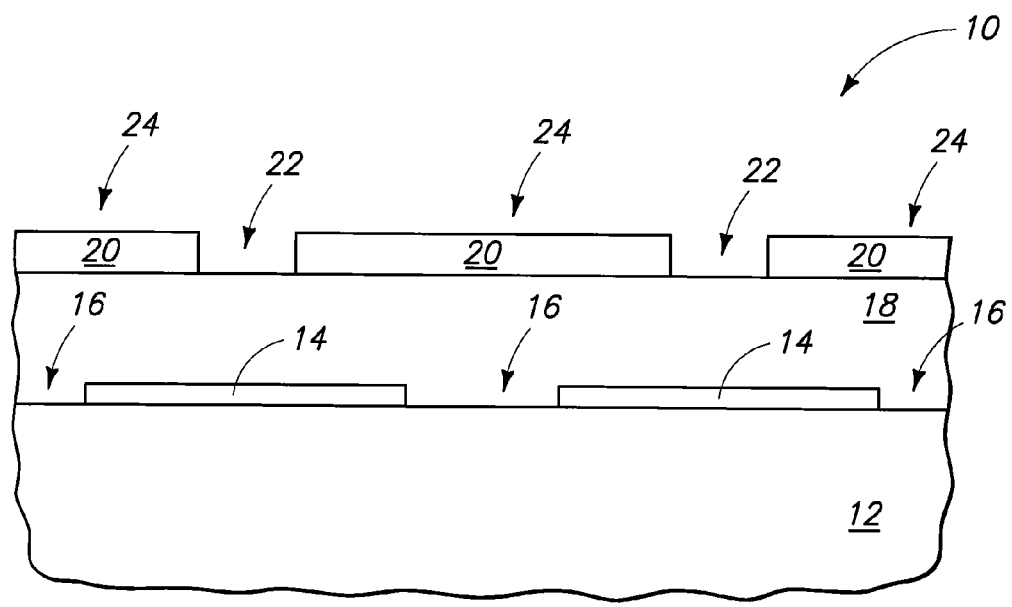

Referring to FIGS. 7 and 8, patterned masking material 20 is provided over semiconductor material 18. The patterned masking material may comprise any suitable composition or combination of compositions, and may, for example, comprise, consist essentially of, or consist of one or more of photoresist, silicon nitride and silicon dioxide. If the patterned masking material corresponds to photoresist, the pattern in the masking material may be formed by photolithographic processing. If the patterned masking material corresponds to one or more compositions other than photoresist, the masking material may be patterned by forming photolithographically patterned photoresist over such compositions, transferring a pattern from the photoresist to the compositions with one or more etches, and then removing the photoresist. In some embodiments, it may be advantageous for masking material 20 to comprise, consist essentially of, or consist of silicon dioxide, as such may eliminate a mask-removal step discussed below with reference to FIGS. 12 and 13.

The patterned masking material 20 forms elliptical islands 24 in the shown embodiment, with such islands being spaced from one another by gaps 22. The islands 24 may be utilized to define locations of active areas within semiconductor material 18, and may be formed in any suitable configuration. Openings 16 in dielectric material 14 (shown in dashed-line view in the top view of FIG. 7) are entirely surrounded by outer peripheries of the islands 24.

Referring to FIGS. 9-11, gaps 22 are extended into semiconductor material 18 with an etch of the semiconductor material. The etch may be selective for material 18 relative to dielectric material 14 so that the etch stops on material 14, as shown. An etch is considered selective for a first material relative to a second material if the etch removes the first material more rapidly than the second material, which can include, but is not limited to, etches which are 100 percent selective for the first material relative to the second material.

The etch of material 18 forms material 18 into a plurality of active regions 26 beneath the islands 24 of masking material 20. The active regions are in one-to-one correspondence with the openings 16 in the shown embodiment.

The active regions 26 may be in the form of pedestals. The individual pedestals have a wider region 28 and a narrower stem region 30, for example, as shown in the cross-section of FIG. 10. The narrow stems pass through the openings 16 in the dielectric material 14. The cross-section of FIG. 10 also shows that portions of dielectric material 14 are between the wide upper regions of active regions 26 and the base 12; and in the shown embodiment the only material spacing the wide upper regions 28 from base 12 is the dielectric material 14.

In some embodiments, materials 12 and 18 may be considered to together correspond to a semiconductor material comprising a base and pedestals joining the base through narrow stems. The description that materials 12 and 18 together correspond to a semiconductor material is descriptive of materials 12 and 18 both comprising semiconductor, and may include, but is not limited to, embodiments in which materials 12 and 18 comprise the same composition as one another.

FIG. 11 shows a cross-section of the active regions 26 substantially orthogonal to that of FIG. 10, and illustrates that the active regions have top surfaces 27 and sidewall surfaces 29 extending downwardly from the top surfaces.

Referring next to FIGS. 12 and 13, an insulative material 32 is formed within gaps 22 and over active regions 26. The active regions 26 and openings 16 are shown in dashed-line view in the top view of FIG. 12 to indicate that such are beneath other materials. The materials 32 and 14 directly contact one another within gaps 22 in the shown embodiment.

Insulative material 32 may comprise any suitable composition or combination of compositions, and may, for example, comprise compositions typically utilized in isolation regions. For instance, insulative material 32 may comprise, consist essentially of, or consist of one or more of silicon dioxide, silicon nitride and silicon oxynitride. The patterned mask 20 (FIGS. 9-11) may be removed prior to formation of insulative material 32, or may be left to become part of the insulative material. If the insulative material 32 comprises the same composition as mask 20, the two can merge into a single structure. For instance, in some embodiments both masking material 20 and insulative material 32 may comprise, consist essentially of, or consist of silicon dioxide.

Insulative material 32 may be referred to as a second dielectric material to distinguish it from the first dielectric material 14.

Figure 14:
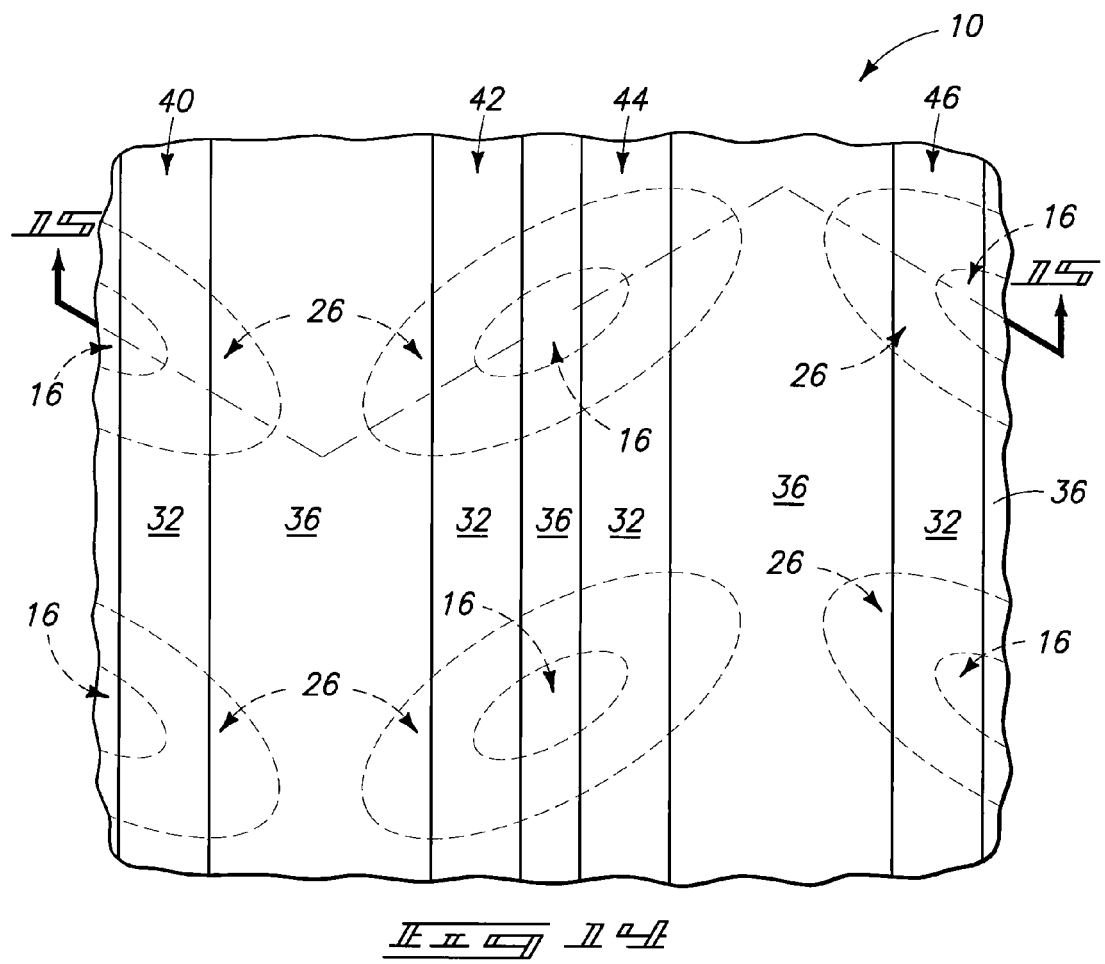
FIGS. 14 and 15 are views of the portions of FIGS. 1 and 2, respectively, at a processing stage subsequent to that of FIGS. 12 and 13. The cross-section of FIG. 15 is along the line 15-15 of FIG. 14.
Figure 15:
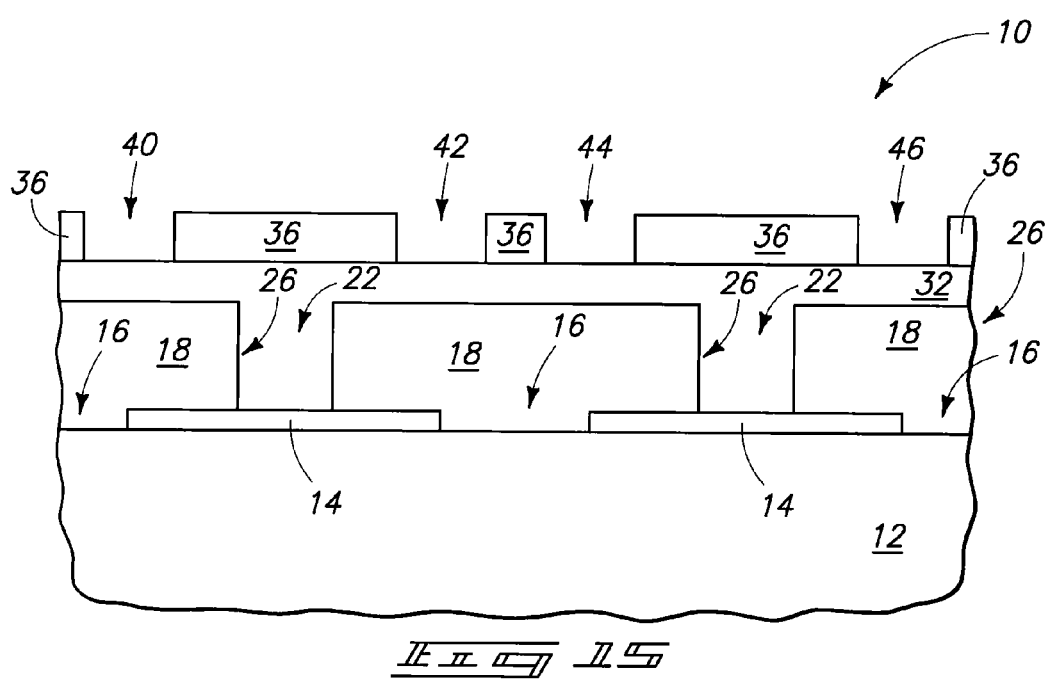

Referring next to FIGS. 14 and 15, a patterned mask of material 36 is formed over insulative material 32. Material 36 may comprise any suitable composition or combination of compositions, and may, for example, comprise photolithographically patterned photoresist.

The patterned mask has a plurality of trenches 40, 42, 44 and 46 extending therethrough. The trenches are paired across individual active regions, as illustrated by the paired trenches 42 and 44 extending across individual active regions within the central portion of the fragment of FIGS. 14 and 15.

Figure 18:
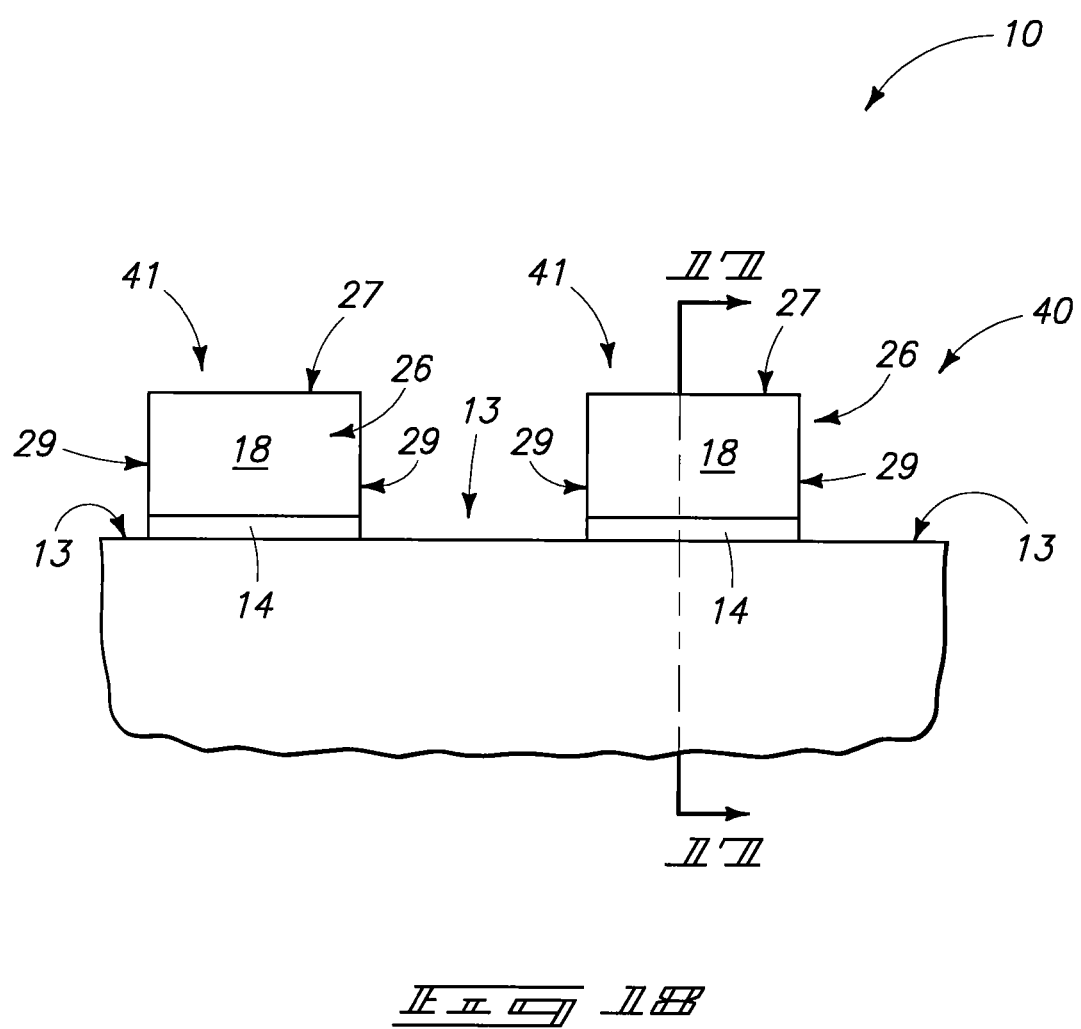

Referring to FIGS. 16-18, trenches 40, 42, 44 and 46 are extended into materials underlying material 36 (FIGS. 14 and 15), and subsequently material 36 is removed. The trenches may be extended with an etch selective for oxide relative to semiconductor material (for instance, selective for silicon dioxide relative to silicon), in some embodiments. In the shown embodiment, the etch removes exposed portions of first and second dielectric materials 14 and 32. Such exposes the upper surfaces 27 of semiconductor material 18 within the trenches 40, 42, 44 and 46.

As discussed previously, upper surface 27 corresponds to the top surfaces of active regions 26. FIG. 18 shows a cross-sectional view along the trench 40, and shows that the etch through material 32 (FIG. 17) has exposed sidewall surfaces 29 of active regions 26, in addition to exposing the top surfaces 27. In some embodiments, the top surfaces and sidewall surfaces may all be generically referred to as "sides", and accordingly the cross-sectional view of FIG. 18 may be considered to show three sides (corresponding to the top surface 27 and the two sidewall surfaces 29) of the active regions 26 exposed within trench 40. The portions of active regions 26 exposed within the trenches may be considered saddle regions (or fin-type regions) 41 due to the non-planar topography of the regions (with such non-planar topography being visible along the cross-section of FIG. 18).

FIG. 18 shows that the etch through material 14 has exposed the upper surface 13 of base 12. In some embodiments, material 14 may comprise a composition resistant to the etch utilized to etch through material 32 so that material 14 is not removed by such etch, and accordingly so that upper surface 13 of base 12 is not exposed by such etch. For instance, in some embodiments dielectric material 32 may comprise silicon dioxide while dielectric material 14 comprises silicon nitride, and the etch through material 32 may be selective for silicon dioxide relative to silicon nitride.

The trenches 40, 42, 44 and 46 formed within material 32 may be considered to be patterned within material 32. In the shown embodiment, the trenches are paired across individual active regions 26, as illustrated by the trenches 42 and 44 being paired across a couple of the shown active regions.

Figure 19:
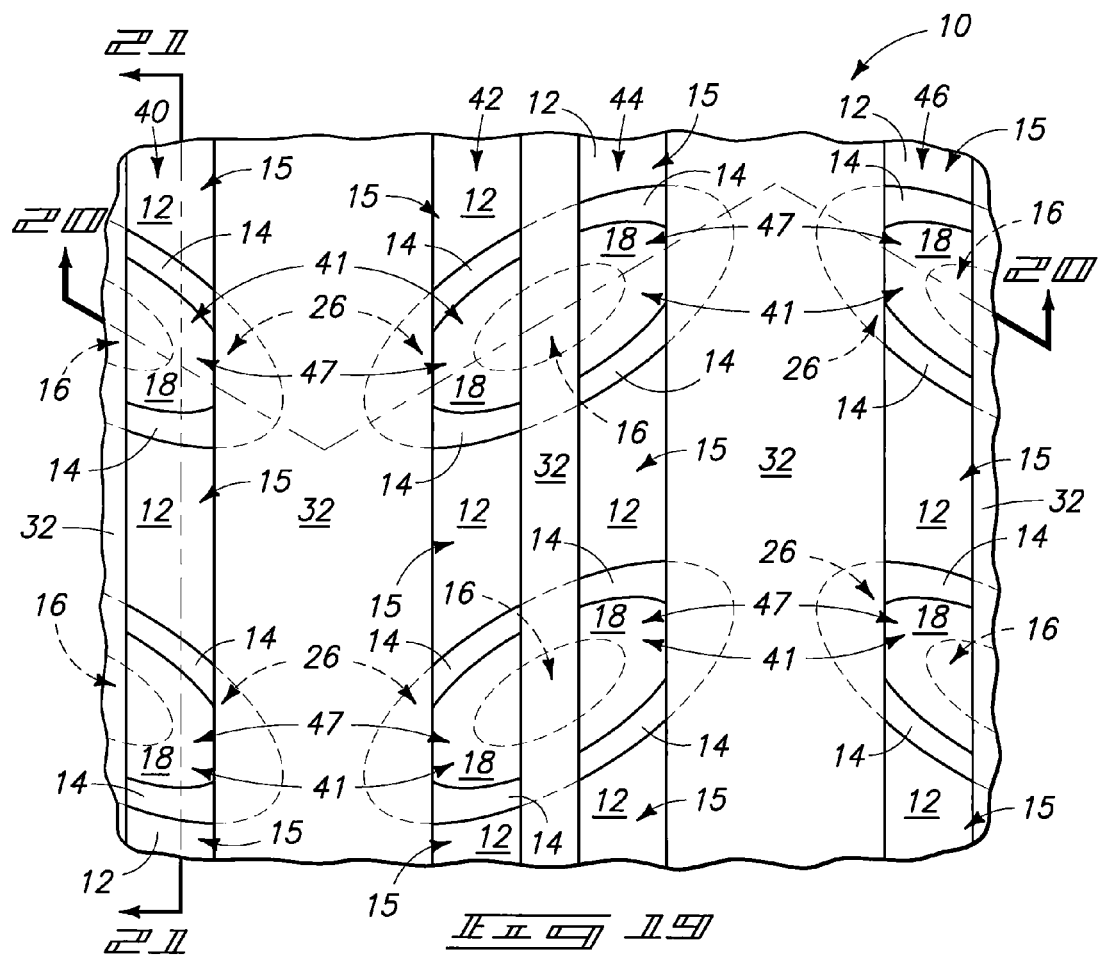
FIGS. 19-21 are views of the portions of FIGS. 9-11 at a processing stage subsequent to that of FIGS. 16-18. The cross-section of FIG. 20 is along the lines 20-20 of FIGS. 19 and 21; and the cross-section of FIG. 21 is along the lines 21-21 of FIGS. 19 and 20.
Figure 20:
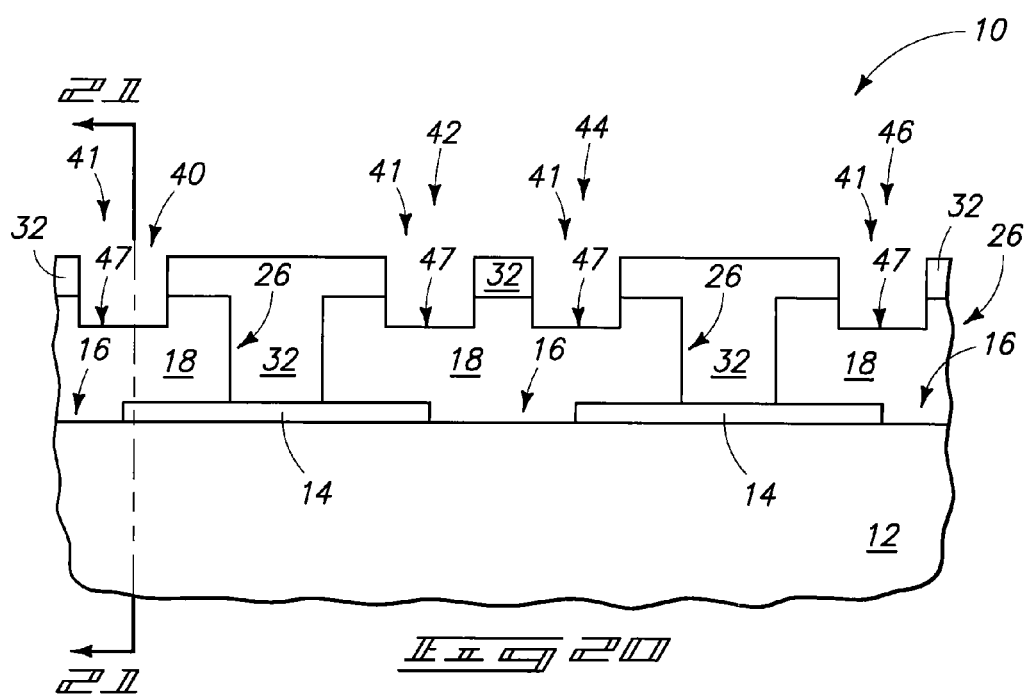
Figure 21:
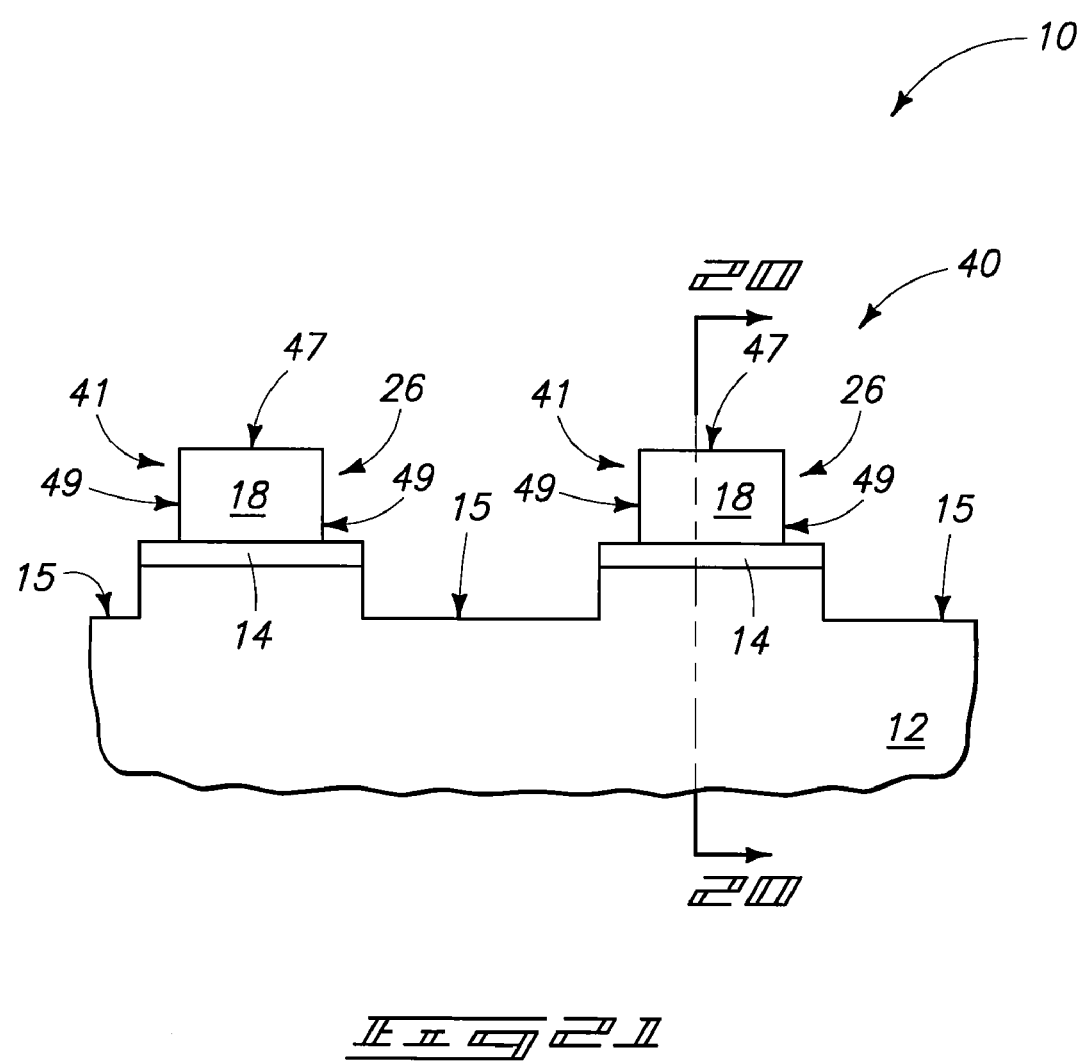

Referring to FIGS. 19-21, the semiconductor material exposed within trenches 40, 42, 44 and 46 is subjected to an isotropic etch. The isotropic etch reduces the height of silicon-containing materials 12 and 18 within the trenches as shown in FIGS. 20 and 21. The isotropic etch also narrows portions of the saddle regions 41 of active regions 26, as shown in FIGS. 19 and 21. The narrowing of the saddle regions exposes upper surfaces of dielectric material 14 adjacent the saddle regions.

The narrowed saddle regions have exposed upper surfaces 47, and exposed sidewall surfaces 49 extending downwardly from the top surfaces. The pair of sidewall surfaces, together with the top surface, may alternatively be referred to as three sides.

The base 12 remaining within trenches 40, 42, 44 and 46 has an exposed upper surface 15 which is beneath the elevation of the original upper surface 13 (FIG. 18). In embodiments in which material 14 remains over base 12 after the processing of FIGS. 16-18, the base 12 will be protected by material 14 and thus not etched by the isotropic etch utilized to narrow the saddle regions 41. Also, in some embodiments semiconductor materials 12 and 18 may comprise different compositions relative to one another so that even if both of materials 12 and 18 are exposed to the isotropic etch that reduces the widths of the saddle regions comprising material 18, such etch may be selective for material 18 relative to material 12 so that material 12 is not appreciably etched during the reduction in the widths of the saddle regions.

The isotropic etch of the saddle regions may be omitted in embodiments in which it is desired to maintain the original widths of the saddle regions.

Figure 24:
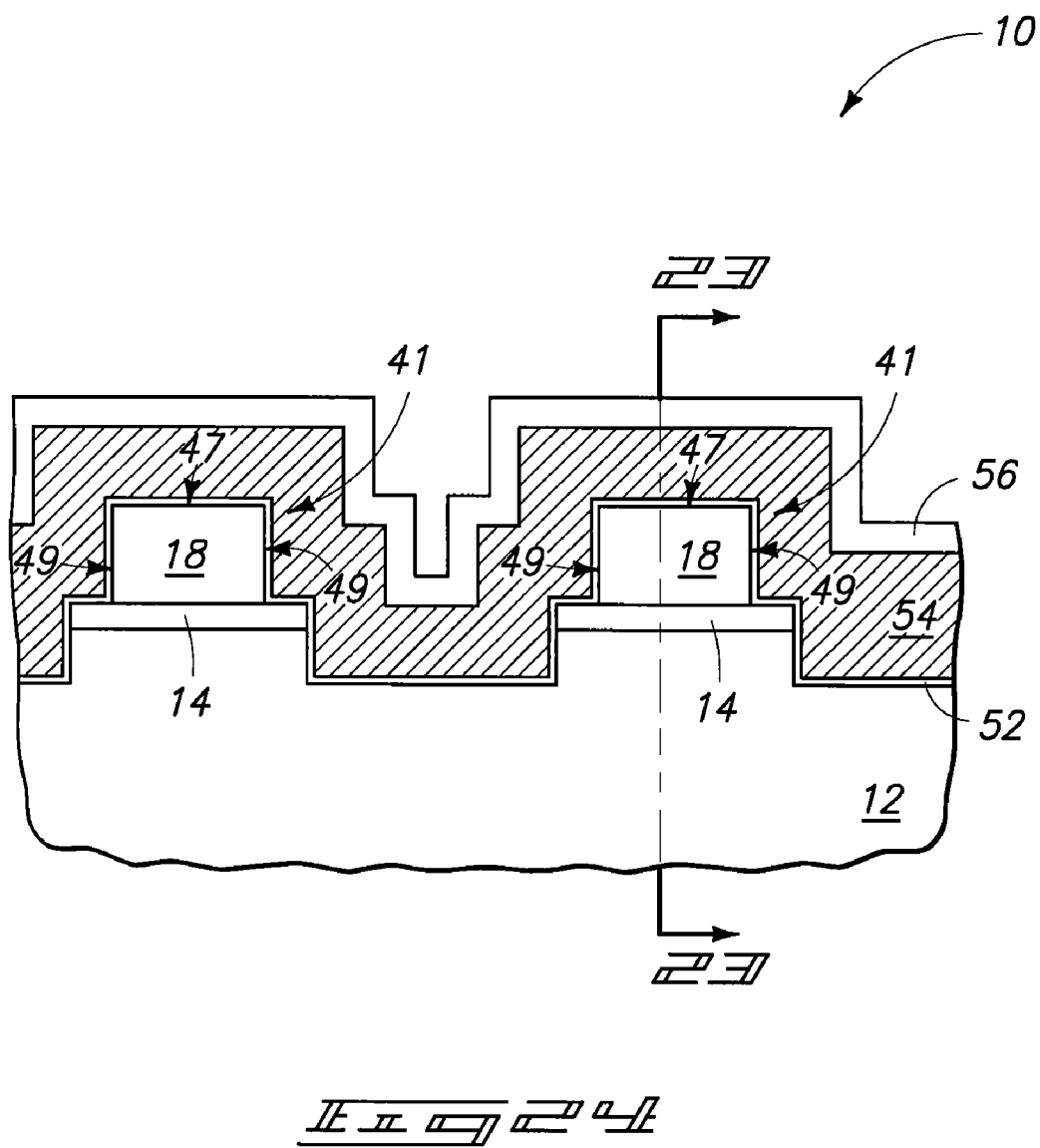

Referring next to FIGS. 22-24, openings 40, 42, 44 and 46 (FIGS. 19-21) are lined with insulative materials 50 and 52. The insulative materials may comprise any suitable electrically insulative composition or compositions; and may be the same in composition as one another or different. For instance, either or both of materials 50 and 52 may comprise, consist essentially of, or consist of one or more of silicon dioxide, silicon nitride, silicon oxynitride, and various high-k materials (with high-k materials being materials having a dielectric constant greater than silicon dioxide, such as, for example, tantalum pentoxide).

Insulative material 50 may be formed by providing a layer of material 50 across an upper surface of material 32 and within the openings 40, 42, 44 and 46, followed by an anisotropic etch of material 50. Subsequently, material 52 may be formed by oxidation of exposed surfaces of semiconductor material 18 within openings 40, 42, 44 and 46 and/or by deposition of desired material within the openings. In other embodiments, material 50 may be formed over material 32 and within the openings, and then patterned so that material 50 remains within the openings to form an entirety of the liners; and thus material 52 may be omitted.

Conductive material 54 is provided within the lined openings. The conductive material forms a series of conductive lines 60, 62, 64 and 66. Electrically insulative caps 56 are formed over the conductive lines. The conductive lines are labeled in the top view of FIG. 22, even though such lines are hidden beneath insulative caps 56. The dielectric material 52, conductive material 54 and insulative caps 56 extend around saddle regions 41, and specifically extend along sidewall surfaces 49 and top surface 47 of the saddle regions, as shown in FIG. 24.

Conductive material 54 may comprise any suitable composition or combination of compositions, and may, for example, comprise, consist essentially of, or consist of one or more of various metals (for instance, tungsten or titanium), metal-containing compositions (for instance, metal silicides or nitrides) and conductively-doped semiconductor materials (for instance, conductively-doped silicon or germanium).

Insulative caps 56 may comprise any suitable composition or combination of compositions, and may, for example, comprise, consist essentially of, or consist of one or more of silicon nitride, silicon dioxide and silicon oxynitride.

Conductive lines 60, 62, 64 and 66 may correspond to wordlines in some embodiments. The lines are paired across individual active regions 26, as shown by lines 62 and 64 being paired over the active regions along the central portion of the fragment shown in FIGS. 22 and 23.

Figure 25:
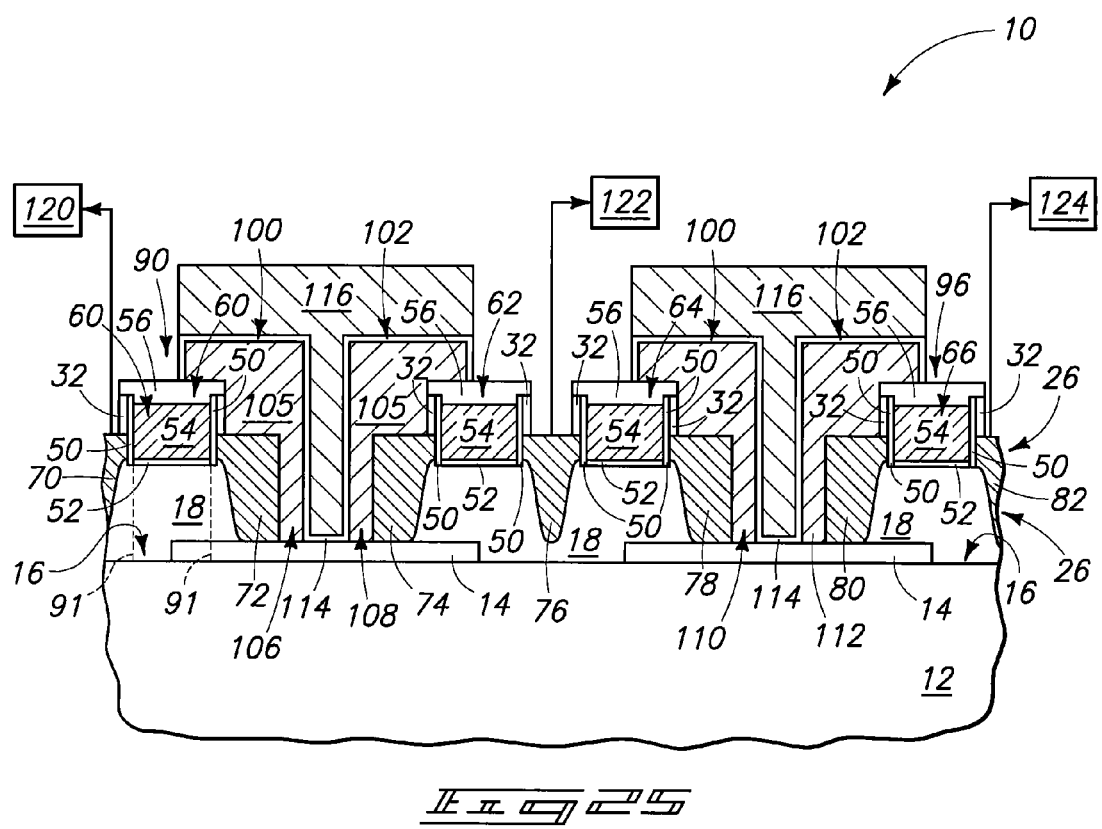
FIG. 25 is a view of the portion of FIG. 2 at a processing stage subsequent to that of FIGS. 22-24.

Referring to FIG. 25, conductivity-enhancing dopant is implanted into active regions 26 to form conductively-doped regions 70, 72, 74, 76, 78, 80 and 82.

Each active region comprises a pair of conductive lines extending thereover (for instance, the lines 62 and 64 extending across the central active region of the fragment of FIG. 25), and comprises three conductively-doped regions (for instance, the conductively-doped regions 74, 76 and 78 formed within the semiconductor material 18 of the central active region of the fragment of FIG. 25). The conductive lines and conductively-doped diffusion regions may together form a plurality of transistor devices. Specifically, the conductive lines may comprise gates of the devices, and the conductively-doped diffusion regions may correspond to source/drain regions gatedly connected to one another through such gates. In the embodiment of FIG. 25, the conductive lines and conductively-doped diffusion regions are shown to form four transistor devices 90, 92, 94 and 96. The devices 92 and 94 are paired within an active region. Three source/drain regions (74, 76 and 78) are within such active region. The source/drain region 76 is between the gates of devices 92 and 94, and is shared by the devices 92 and 94. The source/drain regions 74 and 78 are outward of devices 92 and 94 and gatedly connected to region 76 through the gates of devices 92 and 94 (and specifically through gated control of carrier flow through channel regions beneath such gates). Source/drain region 76 may referred to as an inner region, and source/drain regions 74 and 78 may be referred to as outer regions.

The conductively-doped regions may extend to any suitable depth within semiconductor material 18, and in the shown embodiment extend to a depth which reaches dielectric material 14.

Capacitors 100, 102, 104 and 106 are formed over base 12. The capacitors comprise storage node material 105, dielectric material 114, and capacitor plate material 116. The storage node material and capacitor plate material may be formed of any suitable electrically conductive composition or combination of electrically conductive compositions; and may, for example, comprise, consist essentially of, or consist of one or more of various metals, metal-containing compositions, and conductively-doped semiconductor materials. The dielectric material 114 may comprise any suitable electrically insulative composition or combination of electrically insulative compositions; and may, for example, comprise, consist essentially of, or consist of one or more of silicon dioxide, silicon nitride and various high-k materials.

The storage node material is formed into storage nodes 106, 108, 110, and 112. In the shown embodiment, the insulative material 32 is removed from along sides of the active regions 26 to expose such sides, and the storage nodes extend along the exposed sides of the active regions 26. This can provide for more efficient use of semiconductor real estate relative to constructions in which the capacitors are formed only over an upper surface of the active regions. In the shown embodiment, the storage nodes extend along an entirety of the sidewalls of the active regions. In other embodiments, the storage nodes may extend only partially along the sidewalls of the active regions. In some embodiments, material 32 may be left between the active regions and the capacitors then formed to be entirely over upper surfaces of the active regions.

The gates of the transistor devices are directly over a portion of dielectric material 14, and a portion of opening 16. Dashed lines 91 are provided in FIG. 25 to show the direct overlap of the gate of device 90 over a portion of opening 16 and a portion of dielectric material 14. The direct overlap of the gate over a portion of opening 16 enables the transistor device channel region to be electrically tied with a semiconductor body corresponding to base 12. The direct overlap of the storage node side of the gate over a portion of dielectric material 14 can reduce, and in some embodiments eliminate, leakage from the storage node back across the access device; and thus may reduce or eliminate gate off-state leakage.

The transistor gates may be considered to comprise widths in the shown cross-section, with such widths extending from one side of a conductive line (60, 62, 64 or 66) to the opposing side of the conductive line. The amount of the width directly over dielectric material 14 may be large enough to substantially inhibit gate off-state leakage, and yet not so large as to impair the electrical body tie connection. For example, the amount of the gate width directly over dielectric material 14 may be from about 25 percent to about 75 percent of the total gate width.

The formation of the outer source/drain regions (in other words, the source/drain regions electrically coupled with the storage nodes) directly over dielectric material 14 may reduce, or prevent, leakage from such source/drain regions directly into the semiconductor body corresponding to base 12.

The inner source/drain regions are connected to bitlines 120, 122 and 124. Accordingly, the transistors and capacitors of FIG. 25 may be incorporated into a DRAM array.

FIG. 26 shows a cross-section that is parallel to that of FIG. 25, and that is offset into or out of the page relative to FIG. 25. Specifically, FIG. 25 is a cross-section through the center of a fin (for instance, the fin 41 of FIG. 24), and FIG. 26 is a cross-section along the edge of the fin. Accordingly, FIG. 26 shows the conductive material 54 extending down toward dielectric material 14 along the edge of the fin.

FIG. 27 illustrates an embodiment alternative to that of FIG. 25. In referring to FIG. 27, similar numbering will be used as is utilized above in describing FIGS. 1-26, where appropriate.

The construction of FIG. 27 comprises the electrically conductive material 54 extending within trenches similar to that of FIG. 25, and such material may form gates of transistor devices analogously to the gates discussed above with reference to FIG. 25. Source/drain regions 70, 72, 74, 76, 78, 80 and 82 are shown proximate such gates.

The embodiment of FIG. 27 differs from that of FIG. 25 in that the transistor gates formed from lines 60, 62, 64 and 66 in the FIG. 27 embodiment are entirely directly over dielectric material 14. Thus, the channel regions of the transistor devices are electrically isolated from the body region of base 12. The transistor devices are accordingly electrically floating devices which may be incorporated into a 0C1T memory array.

In the shown embodiment, conductively-doped regions 130, 132, 134 and 136 are formed beneath the channel regions. Such conductive regions may be formed at any suitable processing stage, and may, for example, be formed prior to formation of dielectric material 14 at the processing stage of FIGS. 1 and 2. The conductively-doped regions may be considered conductive wells which may assist in retaining charge on the floating transistors above them. This may reduce a refresh rate associated with the 0C1T memory array.

The various structures described above may be incorporated into electronic systems, such as computers, cell phones, clocks, cars, planes, etc.

Figure 28:
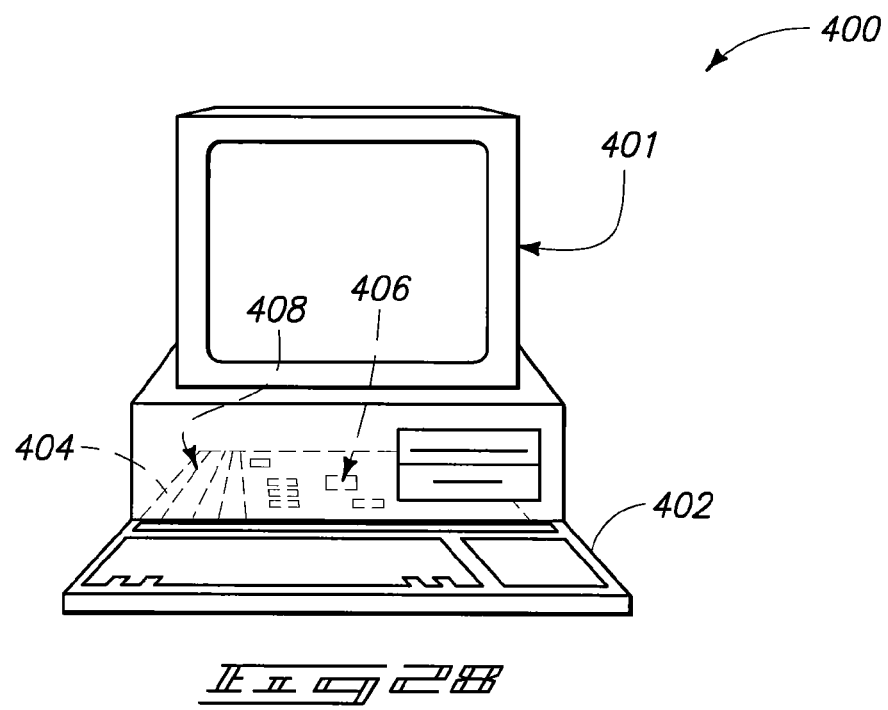
FIG. 28 is a diagrammatic view of a computer embodiment.
Figure 29:
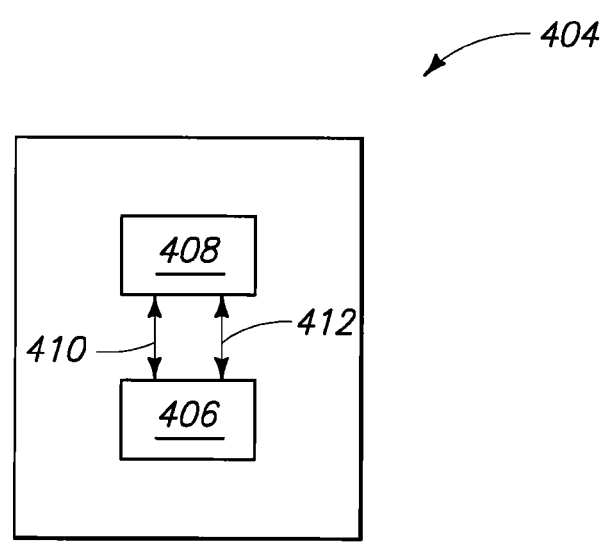
FIG. 29 is a block diagram showing particular features of the motherboard of the FIG. 27 computer embodiment.

FIG. 28 illustrates an embodiment of a computer system 400. Computer system 400 includes a monitor 401 or other communication output device, a keyboard 402 or other communication input device, and a motherboard 404. Motherboard 404 may carry a microprocessor 406 or other data processing unit, and at least one memory device 408. Memory device 408 may comprise an array of memory cells, and such array may be coupled with addressing circuitry for accessing individual memory cells in the array. Further, the memory cell array may be coupled to a read circuit for reading data from the memory cells. The addressing and read circuitry may be utilized for conveying information between memory device 408 and processor 406. Such is illustrated in the block diagram of the motherboard 404 shown in FIG. 29. In such block diagram, the addressing circuitry is illustrated as 410 and the read circuitry is illustrated as 412.

Processor device 406 may correspond to a processor module, and associated memory utilized with the module may comprise DRAM or 0C1T memory structures of the types described above.

Memory device 408 may correspond to a memory module, and may comprise DRAM or 0C1T memory structures of the types described above.

Figure 30:
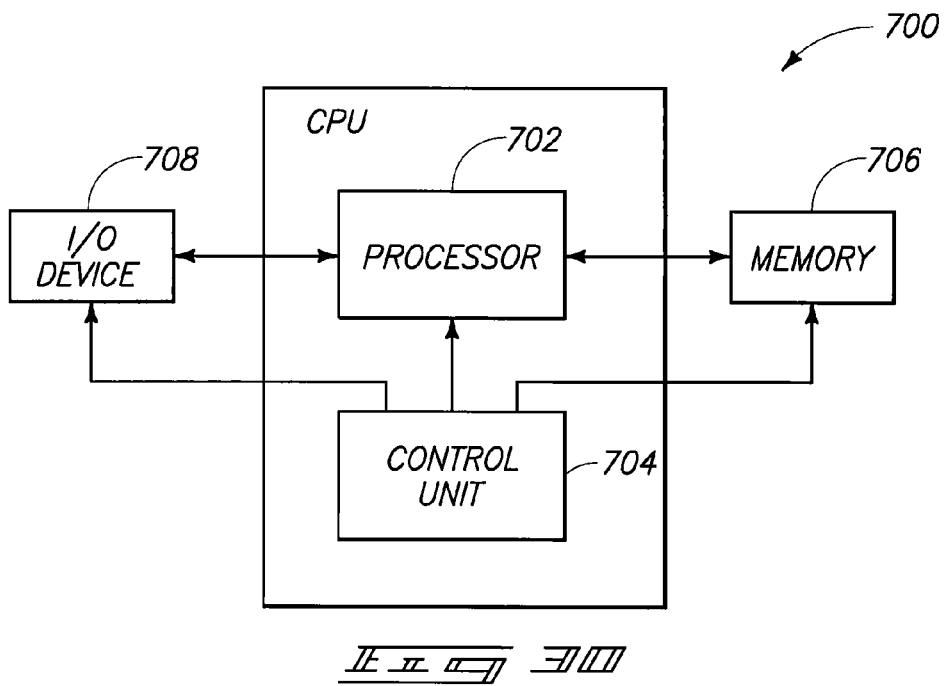
FIG. 30 is a high level block diagram of an electronic system embodiment.

FIG. 30 illustrates a simplified block diagram of a high-level organization of an electronic system 700. System 700 may correspond to, for example, a computer system, a process control system, or any other system that employs a processor and associated memory. Electronic system 700 has functional elements, including a processor 702, a control unit 704, a memory device unit 706 and an input/output (I/O) device 708 (it is to be understood that the system may have a plurality of processors, control units, memory device units and/or I/O devices in various embodiments). Generally, electronic system 700 will have a native set of instructions that specify operations to be performed on data by the processor 702 and other interactions between the processor 702, the memory device unit 706 and the I/O device 708. The control unit 704 coordinates all operations of the processor 702, the memory device 706 and the I/O device 708 by continuously cycling through a set of operations that cause instructions to be fetched from the memory device 706 and executed. The memory device 706 may include DRAM or 0C1T memory structures of the types described above.

Figure 31:
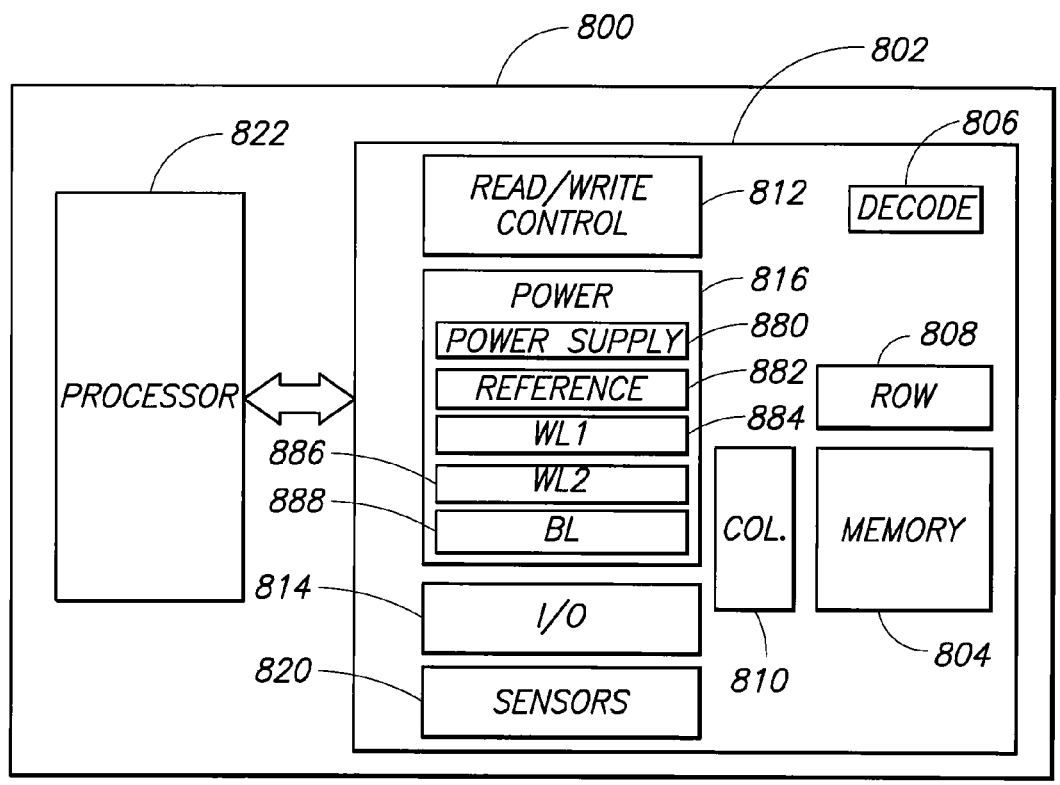
FIG. 31 is a simplified block diagram of a memory device embodiment.

FIG. 31 is a simplified block diagram of an electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing a first wordline with pulses, circuitry 886 for providing a second wordline with pulses, and circuitry 888 for providing a bitline with pulses. The system 800 also includes a processor 822, or memory controller for memory accessing.

The memory device 802 receives control signals from the processor 822 over wiring or metallization lines. The memory device 802 is used to store data which is accessed via I/O lines. At least one of the processor 822 or memory device 802 may include DRAM or 0C1T memory structures of the types described above.

The various electronic systems may be fabricated in single-package processing units, or even on a single semiconductor chip, in order to reduce the communication time between the processor and the memory device(s).

The electronic systems may be used in memory modules, device drivers, power modules, communication modems, processor modules, and application-specific modules, and may include multilayer, multichip modules.

The electronic systems may be any of a broad range of systems, such as clocks, televisions, cell phones, personal computers, automobiles, industrial control systems, aircraft, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A semiconductor construction, comprising:
  a semiconductor material having a base and a plurality of pedestals extending upwardly from the base, the pedestals comprising active regions joining the base through narrow stems;
  a dielectric material over the base; the dielectric material being between the active regions and the base, and having openings therein through which the stems pass;
  wordlines extending across the active regions, the wordlines being paired across the individual of the active regions, segments of the wordlines over the active regions corresponding to transistor gates, both individual transistor gates of the paired transistor gates having portions directly over the dielectric material and having other portions directly over the openings;

conductively-doped source/drain regions within the active regions, three source/drain regions being within individual active regions, one of the three source/drain regions of an individual active region being a shared source/drain region between the paired wordlines associated with the individual active region, the remaining two of the three source/drain regions being outer source/drain regions on opposing sides of the wordlines from the shared source/drain region;

capacitors in electrical connection with the outer source/drain regions; and bitlines in electrical connection with the shared source/drain regions.

2. The construction of claim 1 wherein the outer source/drain regions are directly over the dielectric material.

3. The construction of claim 2 wherein the inner source/drain regions are directly over the openings.

4. The construction of claim 1 wherein the active regions comprise, in cross-sectional view, a top and two sides extending downwardly from the top; and wherein wordlines extend along the top and along at least portions of the two sides.

5. The construction of claim 1 wherein the active regions comprise wide regions and narrow saddle regions between the wide regions; wherein the wordlines pass over the narrow saddle regions; wherein the saddle regions comprise, in cross-sectional view, a top and two sides extending downwardly from the top; and wherein the wordlines extend along the top and two sides of the saddle regions.

6. The construction of claim 1 wherein the active regions comprise top surfaces and sides extending downwardly from the top surfaces; and wherein the capacitors comprise storage nodes in direct contact with the sides of the active regions.

7. The construction of claim 1 wherein the semiconductor material is a same composition throughout the base and the pedestals.

8. An electronic system, comprising:

a processor; and memory in data communication with the processor; the memory comprising:

a plurality of pedestals extending upwardly from a semiconductor base, the pedestals comprising active regions joining the base through narrow stems;

a dielectric material over the base; the dielectric material being between the active regions and the base, and having openings therein through which the stems pass;

wordlines extending across the active regions, the wordlines being paired across individual of the active regions, segments of the wordlines over the active regions corresponding to transistor gates, both individual transistor gates of the paired transistor gates having portions directly over the dielectric material and having other portions directly over the openings;

conductively-doped source/drain regions within the active regions; three source/drain regions being within the individual active regions; one of the three source/drain regions of an individual active region being a shared source/drain region between the paired wordlines associated with the individual active region, the remaining two of the three source/drain regions being outer source/drain regions on opposing sides of the wordlines from the shared source/drain region;

capacitors in electrical connection with the outer source/drain regions; and bitlines in electrical connection with the shared source/drain regions.

9. The electronic system of claim 8 wherein the active regions comprise top surfaces and sides extending downwardly from the top surfaces; and wherein the capacitors comprise storage nodes in direct contact with the sides of the active regions.

10. The electronic system of claim 8 wherein the semiconductor material is a same composition throughout the base and the pedestals.

* * * * *